US011821266B2

(12) United States Patent
Leismer et al.

(10) Patent No.: US 11,821,266 B2
(45) Date of Patent: Nov. 21, 2023

(54) METHOD FOR TESTING OF THE DOWNHOLE CONNECTOR ELECTRICAL SYSTEM DURING INSTALLATION

(71) Applicant: ACCESSESP UK LIMITED, Great Yarmouth (GB)

(72) Inventors: Dwayne Leismer, Houston, TX (US); Andras Bencze, Morden (GB); Rogelio Cantu, Houston, TX (US)

(73) Assignee: ACCESSESP UK LIMITED, Great Yarmouth (GB)

( * ) Notice: Subject to any disclaimer, the term of this patent is extended or adjusted under 35 U.S.C. 154(b) by 0 days.

(21) Appl. No.: 18/102,749

(22) Filed: Jan. 29, 2023

(65) Prior Publication Data

US 2023/0167693 A1  Jun. 1, 2023

Related U.S. Application Data

(60) Division of application No. 16/685,898, filed on Nov. 15, 2019, now Pat. No. 11,572,743, which is a (Continued)

(51) Int. Cl.
*E21B 17/02* (2006.01)
*E21B 43/12* (2006.01)
(Continued)

(52) U.S. Cl.
CPC ........ *E21B 17/0285* (2020.05); *E21B 17/028* (2013.01); *E21B 43/128* (2013.01); *H01R 13/523* (2013.01); *H01R 13/5219* (2013.01)

(58) Field of Classification Search
CPC .. E21B 17/0285; E21B 17/028; E21B 43/128; H01R 13/5219; H01R 13/523
See application file for complete search history.

(56) References Cited

U.S. PATENT DOCUMENTS 3,980,369 A   9/1976 Panek
7,611,339 B2  11/2009 Tetzlaff et al.
(Continued)

FOREIGN PATENT DOCUMENTS

| GB | 2504301 | 1/2014 |
| WO | 2010078326 | 7/2010 |
| WO | 2010122342 | 10/2010 |

OTHER PUBLICATIONS

PCT/ISA—PCT Search Report, Written Opinion and transmittal in application PCT/IB2017/000050 dated May 12, 2017, 11 pages.

*Primary Examiner* — Theodore N Yao
(74) *Attorney, Agent, or Firm* — Gordon G. Waggett, P.C.

(57) ABSTRACT

Disclosed are methods and devices for testing downhole connector electrical systems and cable integrity during installation of a permanent completion, including a customized retrievable plug arm assembly connectable to the completion during RIH, the tool mimicking a retrievable ESP, but without motor, and can be employed with or without pressure isolation. Another method employs a slidable starpoint located within the downhole wet mate connector of the completion to provide continuous electrical contact between the phases when no retrievable assembly is in place. When a retrievable assembly is later put in place, the slidable starpoint is moved into a second position that no longer provides electrical contact between the phases. Another method uses fusible links installed between two conductors within the downhole electrical connector system of the completion to provide similar electrical contact between phases, the fusible link configured to melt away once motor current is sent through the conductors.

7 Claims, 30 Drawing Sheets

Related U.S. Application Data continuation-in-part of application No. 15/408,336, filed on Jan. 17, 2017, now Pat. No. 11,105,160.

(60) Provisional application No. 62/768,037, filed on Nov. 15, 2018, provisional application No. 62/279,757, filed on Jan. 16, 2016.

(51) Int. Cl.
  H01R 13/52 (2006.01)
  H01R 13/523 (2006.01)

(56) References Cited

U.S. PATENT DOCUMENTS

| | | |
|---|---|---|
| 8,113,273 B2 | 2/2012 | Manke et al. |
| 8,664,817 B2 | 3/2014 | Rumbaugh et al. |
| 8,692,115 B2 | 4/2014 | Rumbaugh et al. |
| 8,919,432 B1 | 12/2014 | Tetzlaff et al. |
| 8,931,552 B2 | 1/2015 | Head |
| 8,950,476 B2 | 2/2015 | Head |
| 8,985,226 B2 | 3/2015 | Head |
| 9,028,264 B2 | 5/2015 | Head |
| 9,054,615 B2 | 6/2015 | Tead et al. |
| 11,105,160 B2 | 8/2021 | Leismer et al. |
| 2002/0129945 A1 | 9/2002 | Brewer et al. |
| 2002/0192090 A1 | 12/2002 | Du et al. |
| 2005/0016769 A1 | 1/2005 | Wallace |
| 2007/0284117 A1 | 12/2007 | Smithson |
| 2012/0312528 A1 | 12/2012 | Rayssiguier |
| 2013/0040480 A1 | 2/2013 | Frey et al. |
| 2014/0030904 A1* | 1/2014 | Head .................... H01R 13/523 439/283 |
| 2015/0354328 A1 | 12/2015 | Jenisch et al. |
| 2017/0204680 A1 | 7/2017 | Leismer et al. |
| 2018/0168078 A1* | 6/2018 | Deltor ................. H05K 9/0098 |
| 2020/0052442 A1* | 2/2020 | Yuratich .............. H02G 15/105 |

* cited by examiner

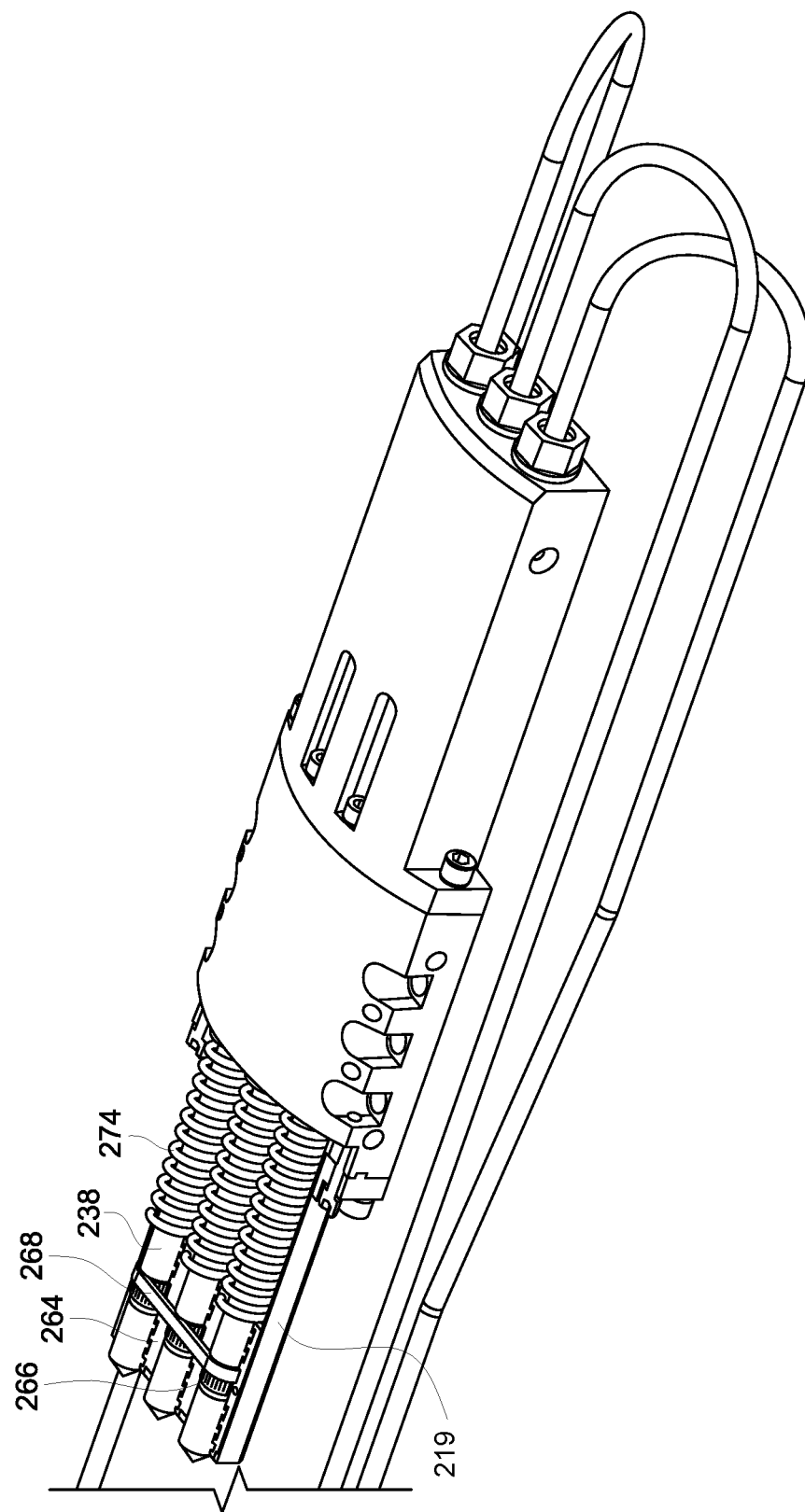

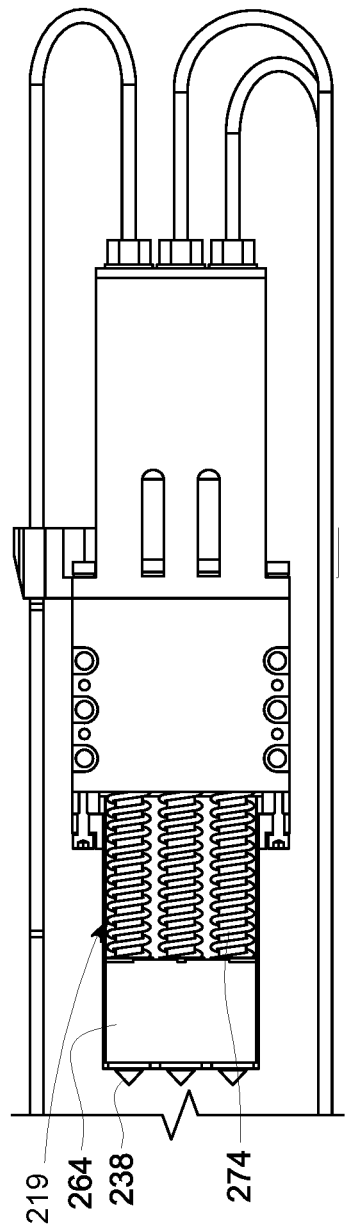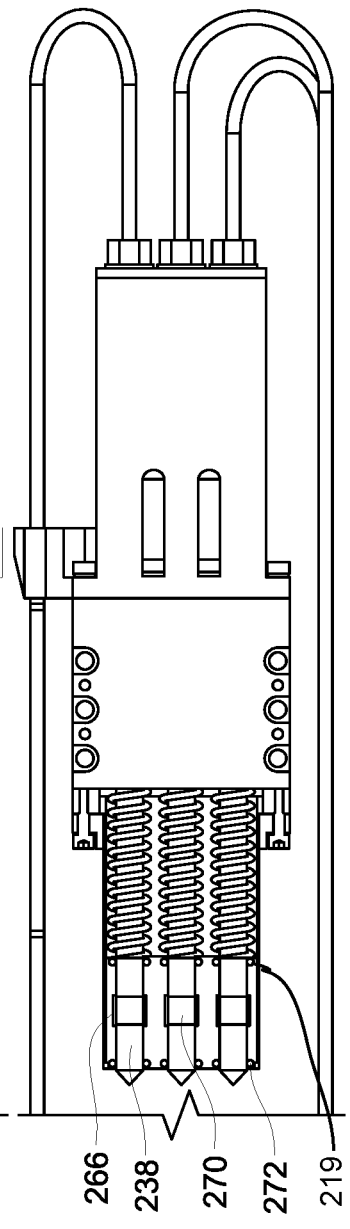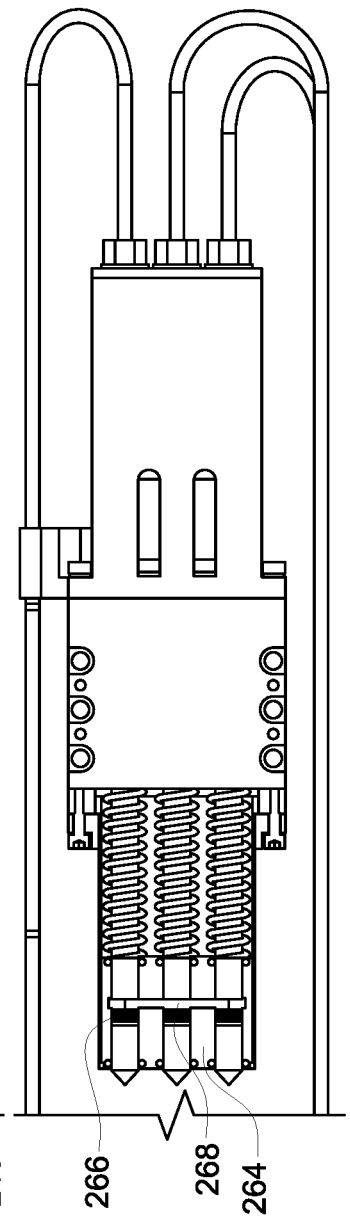

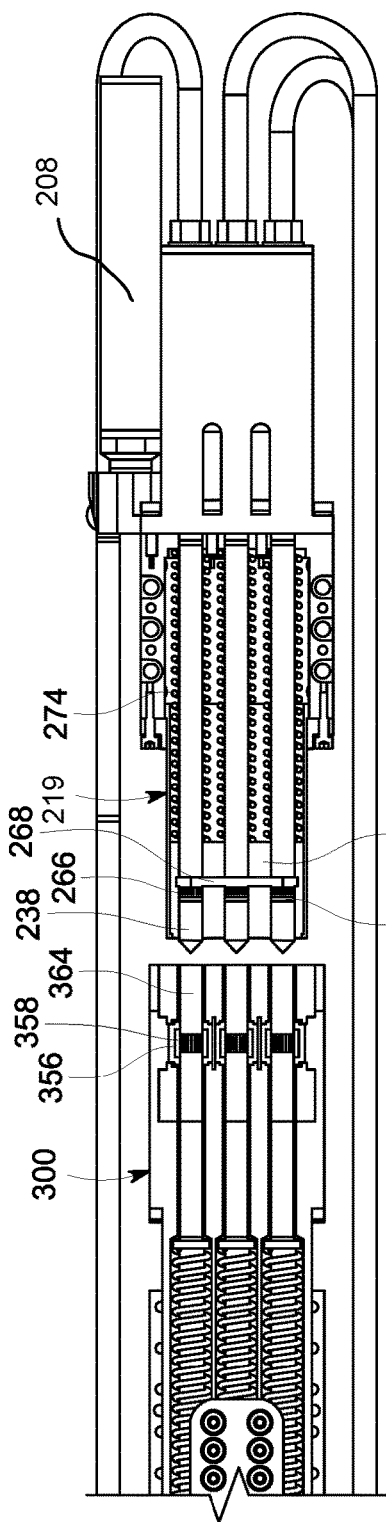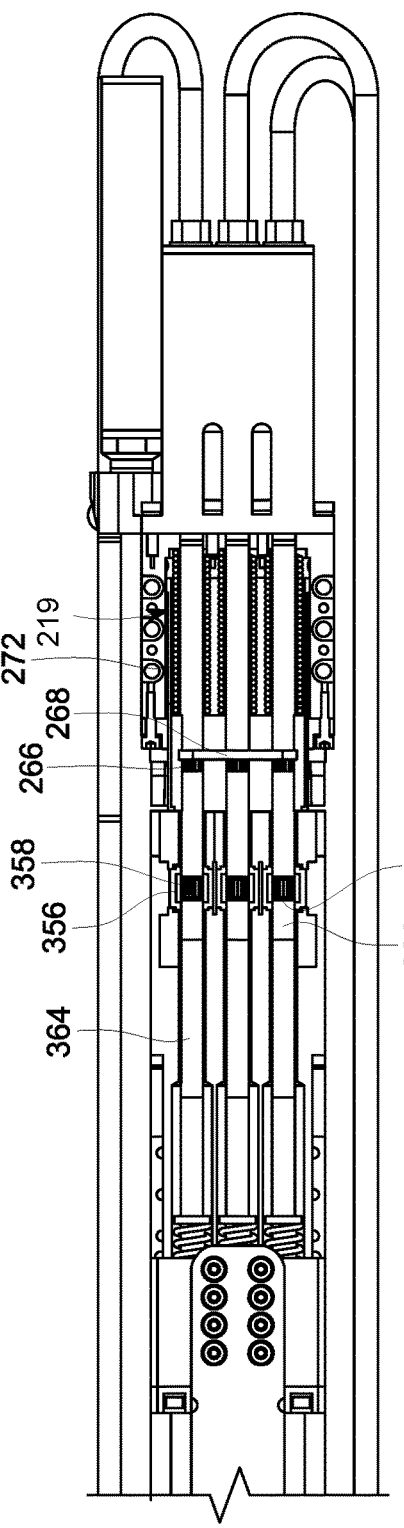

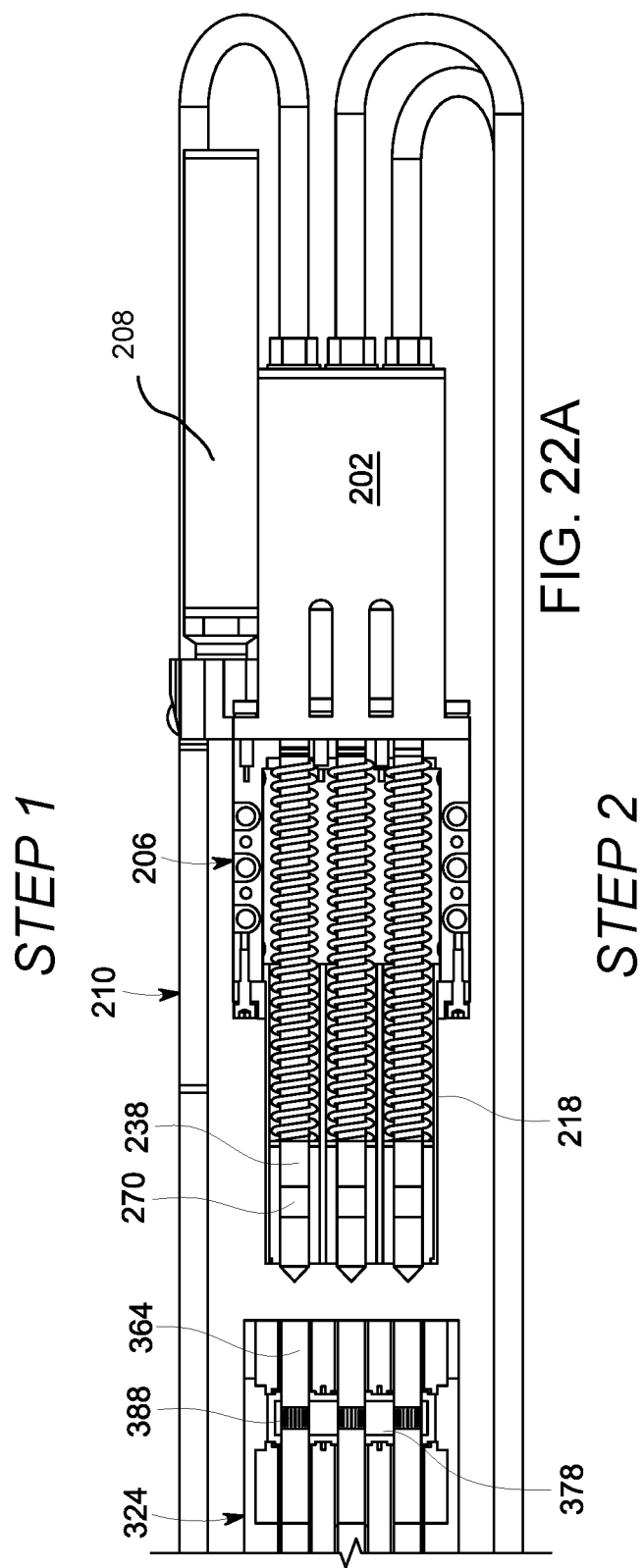
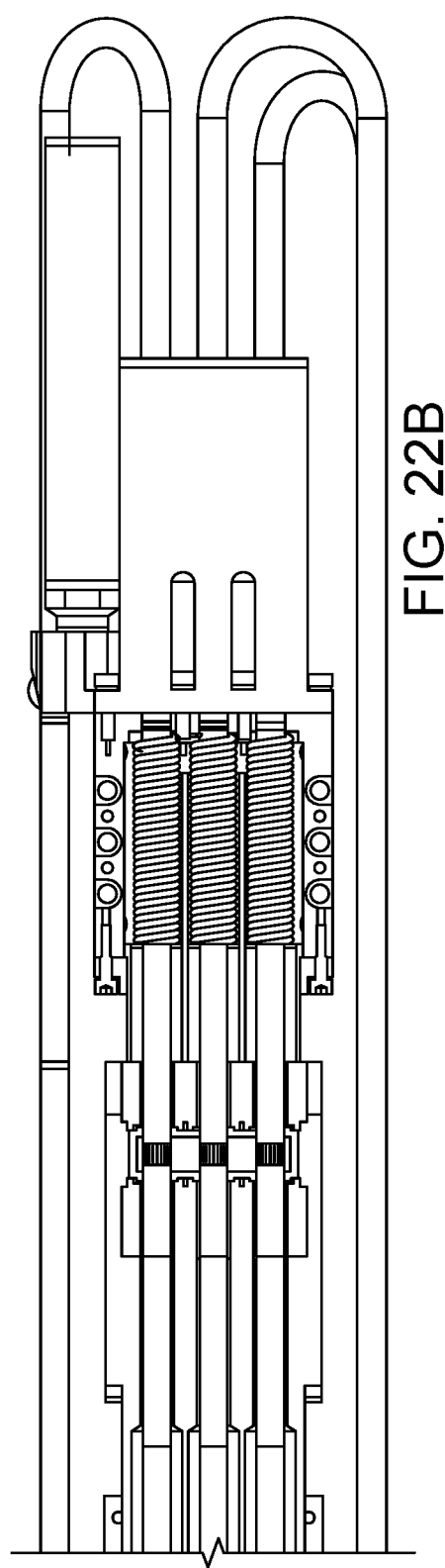

METHOD FOR TESTING OF THE DOWNHOLE CONNECTOR ELECTRICAL SYSTEM DURING INSTALLATION

CROSS-REFERENCE TO RELATED APPLICATIONS

This application is a divisional patent application of copending U.S. application Ser. No. 16/685,898 filed Nov. 15, 2019, Confirmation No. 4990, entitled "Method and Apparatus for Testing of the Downhole Connector Electrical System During Installation," now U.S. Pat. No. 11,572,743 issuing Feb. 7, 2023, which in turn claims the benefit of the filing date of and priority to: U.S. Provisional Application Ser. No. 62/768,037 filed Nov. 15, 2018, Confirmation No. 1013 and is a continuation in part of U.S. Nonprovisional patent application Ser. No. 15/408,336 filed on Jan. 17, 2017, now U.S. Pat. No. 11,105,160 which in turn claims the benefit of U.S. Provisional Patent application 62/279,757 entitled "Low Profile, Pressure Balanced, Oil Expansion Compensated Downhole Electrical Connector System" filed Jan. 16, 2016. These applications are incorporated herein by reference for all purposes.

STATEMENT REGARDING FEDERALLY SPONSORED RESEARCH OR DEVELOPMENT

Not Applicable.

FIELD OF INVENTION

The present disclosure relates generally to permanent downhole electrical connector systems installed onto a permanent completion use, e.g., with ESP applications. The present disclosure also relates generally to methods and tools for testing cable integrity, monitoring permanent downhole connecting system and motor condition.

BACKGROUND OF THE INVENTION

Electrical submersible pump (ESP) systems require connection to an electric power supply, which drives the motor (not specific to motor type). Conventional ESPs typically use electrical connectors that are assembled manually—these are simple plug and socket type connections, which must be fitted in a controlled environment.

In a conventional ESP application (tubing deployed ESP), the electrical power is supplied to the electric motor from a surface variable speed drive (VSD) via an ESP cable. The ESP cable is installed onto the production tubing during the ESP installation and it is normally terminated in a motor lead extension (MLE) which incorporates a pothead. The pothead is connected to the motor during the installation. The ESP system is installed on the end of the tubing, hence the term "tubing deployed ESP".

In case of a retrievable ESP system, such as those offered by AccessESP, a permanent completion is installed and then the ESP cable is installed onto the production tubing and onto the ESP permanent completion and it connects to the permanent downhole wet connector (fixed end). The motor and pump system is typically deployed inside the production tubing using slickline (SL) and the electrical connection to the permanent completion is performed at depth. The electrical power is transferred to the motor through the retrievable connector (plug head), when the retrievable connector is connected to the permanent downhole wet connector.

During the ESP installation, it is desirable to monitor the condition of the ESP cable and the downhole equipment by taking repeated electrical measurement at the ESP cable end at surface. The measurement provides information about the condition of the cable/motor winding conductor (conductor resistance) and the cable/motor insulation (the insulation resistance).

The requirement for an ESP cable testing and the downhole equipment condition monitoring while deploying the permanent completion has led to developing several test methods. Any of the methods described herein may be utilized, depending on the well environmental and operational conditions and/or the installation requirements.

Most commonly, in the through tubing ESP applications, the ESP cable and the permanent downhole connector system integrity test may be conducted similar to conventional ESP systems. In a conventional ESP system, low to medium test voltage is applied to the free end of the ESP cable conductor at surface and the insulation resistance is measured through the armour (ground) repeatedly during the installation.

The difference between the conventional and the through tubing deployed ESP systems is that, because the retrievable assembly is not installed in the string while deploying the permanent completion, the condition of the cable/motor winding (copper conductor continuity and resistance) and the motor insulation (insulation resistance) integrity cannot be monitored.

BRIEF SUMMARY OF THE INVENTION

The present invention describes a variety of methods and equipment developed for testing the ESP cable integrity, and for monitoring the permanent downhole wet connector and motor condition during the permanent completion installation.

In one aspect, a method of testing downhole electrical cable installation with a retrievable assembly includes connecting, the retrievable assembly to a permanent downhole connector while a permanent completion is within a predefined range and deploying one or more completions to a user defined depth. Electrical measurements are collected during run in hole (RIH), whenever a pre-determined interval is reached. One or more of a condition of a motor winding, a condition of permanent downhole connector and a motor insulation integrity are monitored, through the collected electrical measurement.

In another aspect, a method of testing downhole electrical cable installation with a retrievable electrical plug arm assembly includes customizing the retrievable electrical plug arm assembly in association with a permanent completion and connecting, through a mechanical connection, the retrievable electrical plug arm assembly to a permanent downhole connector. The permanent downhole connector is one of pressure isolated and not pressure isolated. Further, when the permanent downhole connector is not pressure isolated, one or more of a motor guide, finishing neck, and the retrievable electrical plug arm assembly are connected. When the permanent downhole connector is pressure isolated, mechanical connection is sealed with one or more sealing packs. Further, electrical measurements are collected, during run in hole (RIH), whenever a pre-determined interval is reached. The collected electrical measurements are used to monitor one or more of a conductor resistance, a cable insulation resistance, and a condition of permanent downhole connector.

In yet another aspect, a method of testing downhole electrical cable installation includes associating an apparatus with a slider of a downhole permanent wet mate connector. The apparatus is used to provide a continuous electrical contact between one or more phases in an absence of a retrievable assembly. A conductor resistance is measured between one or more phases through a cable conductor from a surface while one of run in hole and pull out of hole at a predefined depth. When a retrievable assembly is deployed, the continuous electrical contact is deactivated by pushing away the permanent wet mate connector, by a plug head, from an electrical contact area associated with electrodes. When the retrievable assembly is removed, the plug head is disconnected to return the permanent downhole wet mate connector, through a spring force, to reactivate the continuous electrical contact.

In another aspect, a method of testing downhole electrical cable installation includes creating a common connection point for one or more phases through a fusible element connected to the permanent downhole connector wire conductor. The fusible element is placed between two or more phases. One or more of a cable conductor continuity, resistance between two or more phases, and insulation resistance of the installation while in RIH at a predefined depth are tested. The fusible element is configured for an amount of current flowing through the permanent downhole connector wire conductor. The amount of current will melt the fusible element when a motor associated with downhole electrical cable installation is operated. The common connection point is deactivated for the one or more phases when the fusible element melts.

One embodiment discloses a wet mate electrical connector for installation on a downhole permanent completion assembly, the wet mate electrical connector capable of connecting to a retrievable tool female connector. The wet mate electrical connector further comprises a housing manifold having a first closed end, a second open end, an interior chamber, and interior guide tracks extending perpendicularly from the housing manifold second open end into the interior chamber. One or more electrodes are contained within the housing. Each electrode defining a phase and further comprising an outer surface, a first electrode end proximate the housing manifold first end and connectable, via a power lead connection located in the housing manifold first end, to a separate electrical power lead extending from a surface electrical power source. Each electrode also has a second electrode end section extending out of the housing manifold second end, the second electrode end section containing an electrical block band contact area located around the electrode outer surface, the electrical contact band capable of transmitting electrical signals to a corresponding electrical contact band in a female connector once connected thereto.

The wet mate electrical connector further comprises a retractable electrode housing having a first end slidably connected to and extending into the housing manifold second end and a second retractable electrode housing end extending out of the housing manifold to cover the electrodes. The retractable electrode housing further comprises one or more guide tracks slidably connected to the housing manifold interior guide tracks to guide the movement of the retractable electrode housing within the housing manifold. The retractable electrode housing is capable of moving between a first closed position covering the electrodes, and a second open position when retracted into the housing manifold. The retractable electrode housing second end has an electrode end face comprising one or more apertured openings permitting the one or more electrode second end sections to extend therethrough when the retractable electrode housing moves inwardly into the second, open position within the housing manifold. The retractable electrode housing further comprises a shoulder stop capable of abutting a mechanical stop built into the housing manifold to set a fixed position for the first closed position of the retractable electrode housing.

The wet mate electrical connector further comprises a slidable metal common connection starpoint contact block mounted within the retractable electrode housing and having one or more apertured openings permitting the one or more electrode second end sections to extend therethrough. The slidable metal common connection starpoint contact block is capable of occupying a first position contacting at least a part of each of the electrical contact bands of each of the one or more electrodes to create a bridge contact across all of the one or more electrode contact bands when the retractable electrode housing is in its first position covering the electrodes. The slidable metal common connection starpoint contact block is capable of occupying a second retracted position within the retractable electrode housing not contacting any of the electrical contact bands of each of the one or more electrodes to disconnect the bridge contact across all of the one or more electrodes, when the retractable electrode housing is in its second, retracted position.

An insulated cover surrounds and is secured to the slidable metal common connection, and further comprises a corresponding one or more apertured openings aligned with the slidable metal common connection starpoint contact block apertured openings to permit the one or more electrodes to pass therethrough. One or more sealing elements are positioned on both sides of the electrical contact bands of each of the one or more electrodes to seal off the area of each electrical contact band from intrusion by wellbore fluid.

One or more springs are mounted over each of the one or more electrodes, positioned between the insulated cover and the housing manifold first closed end, the springs tensioned to maintain the retractable electrode housing in its first closed position in the absence of a connection being made with the retrievable tool female connector, and to permit the retractable electrode housing to be moved to its second open position when a connection is made with the retrievable tool female connector.

In this embodiment, when the retractable electrode housing is in its first closed position in the absence of a connection being made with the retrievable tool female connector, the slidable metal common connection starpoint contact block occupies its first position permitting common contact across all of the contact bands of each of the one or more electrodes to permit monitoring for any change in continuity of the one or more electrical power leads once connected to the respective one or more power lead connections. When the retrievable tool female connector is connected to the wet mate connector, the retractable electrode housing is moved to its second open position, the slidable metal common connection starpoint contact block is moved to its second position, and the contact bands of each of the one or more electrodes are permitted to make electrical contact with corresponding one or more electrical contact bands in the retrievable tool female connector. When the retrievable tool female connector is disconnected from the wet mate connector, the retractable electrode housing is moved back to its first, closed position by the force of the sprints, the slidable metal common connection starpoint contact block again occupies its first position permitting common contact across all of the contact bands of each of the one or more electrodes to again permit monitoring for any change in continuity of the one or more electrical power leads connected to the respective one or more power lead connections.

This wet mate connection embodiment may further comprise fluid compensation with dielectric fluid within to further prevent well bore fluid intrusion. For example, the wet mate connection may further comprise a first inside chamber within the housing manifold; a second inside chamber with the retractable electrode housing; one or more electrical conduits having an internal annular space surrounding an electrical wire/cable, a first conduit end and a second conduit end, the first conduit end being connected to one of the one or more power lead connections located in the housing manifold, wherein the conduit annular space is in fluid communication with the housing manifold first inside chamber and the retractable electrode housing second inside chamber and defining a fluid flow path; a dielectric fluid port in fluid communication with the first inside chamber within the housing manifold for introducing a dielectric fluid into the fluid path, the dielectric fluid creating an internal fluid pressure; and a bellows having first and second ends, and an interior annular chamber, the first bellows end being connected to the connector housing in fluid communication with the housing inside chamber, the bellows second end being exposed to downhole wellbore fluid pressure and capable of reacting to the wellbore pressure to cause the bellows to provide a compensating adjustment to the internal fluid pressure.

In one embodiment, the wet mate electrical connector is installed on a downhole permanent completion assembly. The wet mate electrical connector is capable of connecting with a retrievable tool such as a retrievable ESP assembly.

There is also disclosed a method of monitoring for any change in continuity of conductors in electrical power leads connected to a wet mate connector on a downhole permanent completion comprising the steps of: installing a wet mate connector on the downhole permanent completion employing the slidable starpoint feature described herein; running the permanent completion in hole (RIH); measuring the conductor resistance between two of the phases through the power lead from the surface while RIH; measuring the conductor resistance between two of the phases through the power lead from the surface at a set depth; and/or measuring the conductor resistance between two of the phases through the power lead from the surface when pulling out of hole (POOH).

This method can further comprise the further steps of connecting the retrievable ESP assembly (or other retrievable tool) thereby moving the slidable metal common connection starpoint contact block to its second position and discontinuing such measuring of conductor resistance. If the retrievable device is then disconnected, the slidable metal common connection starpoint contact block returns to its first position and measuring of conductor resistance can begin again.

In another embodiment of the present disclosure, there is described a customized downhole retrievable tool for monitoring changes in continuity of conductors in electrical power leads connected to a wet mate connector on a downhole permanent completion, comprising: a tubular structure having a lower end and an upper end, the tubular structure further comprising a mating unit at the lower end, a plug arm assembly comprising a female connector assembly capable of connecting to a wet mate connector on a downhole permanent completion, and a plug arm orienting section at the upper end. This customized downhole retrievable tool may further comprise an isolation sleeve. This tool can also be used in a method of monitoring for any change in continuity of conductors in electrical power leads connected to a wet mate connector on a downhole permanent completion comprising the steps of: installing this customized downhole retrievable tool into the downhole completion; running the permanent completion in hole (RIH); measuring the conductor resistance between two conductor phases through a power lead from the surface while RIH; measuring the conductor resistance between the two phases through the power lead from the surface at a set depth; and/or measuring the conductor resistance between the two phases through the power lead from the surface when pulling out of hole (POOH). The method can further utilize the step of installing an isolation sleeve in the customized downhole retrievable tool.

In yet another embodiment, there is disclosed a wet mate electrical connector for installation on a downhole permanent completion assembly, the wet mate electrical connector capable of connecting to a retrievable tool female connector. This wet mate electrical connector is similar in structure to the embodiment described herein using a a slidable metal common connection starpoint contact block feature, but does not comprise this feature. This embodiment further comprises one or more fusible links electrically connected across each of the one or more electrodes within the housing manifold, the fusible links forming a starpoint connection across all of the electrodes, the fusible links being capable of melting away once current is applied to the electrodes to disable the starpoint bridge, the fusible links being housed within an insulated carrier. When the retrievable tool female connector is connected to the wet mate connector, the retractable electrode housing is moved to its second open position, and the contact bands of each of the one or more electrodes are permitted to make electrical contact with corresponding one or more electrical contact bands in the retrievable tool female connector. The fusible links, while intact, create an electrical bridge across the electrode conductors to permit monitoring for any change in continuity of conductors until current is applied through the power leads. A method is also describe for monitoring for any change in continuity of conductors in electrical power leads connected to a wet mate connector on a downhole permanent completion comprising the steps of: installing wet mate electrical connector capable of connecting to a retrievable tool female connector, the wet mate electrical connector further comprising fusible links as described herein; running the permanent completion in hole (RIH); measuring the conductor resistance between two conductor phases through a power lead from the surface while RIH; measuring the conductor resistance between the two phases through the power lead from the surface at a set depth; and/or measuring the conductor resistance between the two phases through the power lead from the surface when pulling out of hole (POOH).

BRIEF DESCRIPTION OF THE SEVERAL VIEWS OF THE DRAWINGS

FIG. 19 shows the connector system of FIG. 18 with its housing 218 removed (for ease of viewing) and further shows a partial cross-sectional view removing the top half of the contact block insulator housing 264 (for ease of viewing).

FIG. 20A shows a top view of the connector system of FIG. 18 with its housing 218 removed (for ease of viewing).

FIG. 20B shows a top view of the connector system of FIG. 20A further with the top half of the electrical block band contact 266 removed (for ease of viewing) and with the common electrical contact block 268 removed (for ease of viewing).

FIG. 20C shows a top view of the connector system of FIG. 19.

FIG. 21A shows a top view of a connector system employing a bellows accumulator 208 (with some partial cross-sectional views) with starpoint connection shown in a disconnected state just prior to being connected to, e.g., retrievable assembly.

FIG. 21B shows a top view of the connector system of FIG. 21A (with some partial cross-sectional views) with the starpoint connection shown in a connected state after being connected to a retrievable assembly.

FIG. 22A shows a top view of a connector system employing a bellows accumulator 208 (with some partial cross-sectional views) with starpoint connection shown in a disconnected state just prior to being connected to, e.g., a custom-built retrievable test plug arm assembly.

FIG. 22B shows a top view of the connector system of FIG. 22A (with some partial cross-sectional views) such as generally shown in lines 21B-21B of FIG. 7 with the starpoint connection shown in a connected state after being connected to a custom-built retrievable test plug arm assembly.

DETAILED DESCRIPTION OF THE INVENTION

Reference is now made to the drawings which depict various embodiments of the present disclosure, but are not drawn to scale.

In one or more embodiments, during an ESP installation, the condition of ESP cable and downhole equipment may be monitored by taking repeated electrical measurement at the ESP cable end at surface. The measurement provides information about the condition of the cable/motor winding conductor (conductor resistance) and the cable/motor insulation (the insulation resistance).

Several testing/monitoring options can be implemented in the through tubing ESP application as will be discussed more fully below:

Method 1: This existing method employs electrical testing with the retrievable assembly installed (e.g., FIGS. 1-7 for a depiction of a retrievable assembly installed with standard installation). This method is known in the art and continues to have utility. However, there exists a need to be able to measure cable continuity while RIH during installation of the permanent completion and thereafter without employing a retrievable ESP system.

Method 2: This new method involves electrical testing with a custom test plug arm assembly installed with or without pressure isolation (e.g., FIGS. 8-17).

(3) Electrical testing through a built-in star-point in the permanent downhole wet mate connector (e.g., FIGS. 18-22B).

Figure 23:
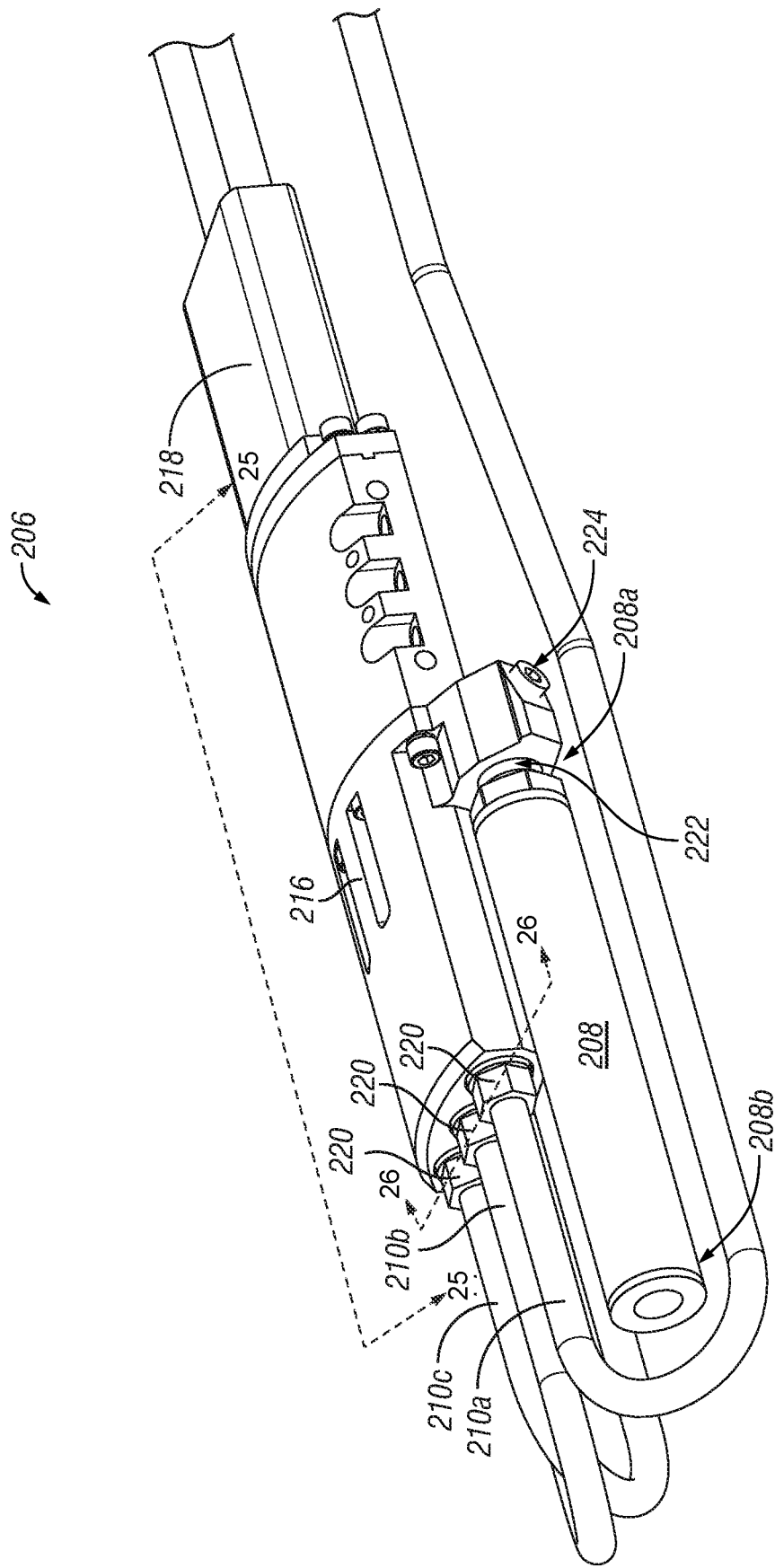
FIG. 23 is an enlarged perspective view of the wet mate connector according to an embodiment of the present disclosure.
Figure 24:
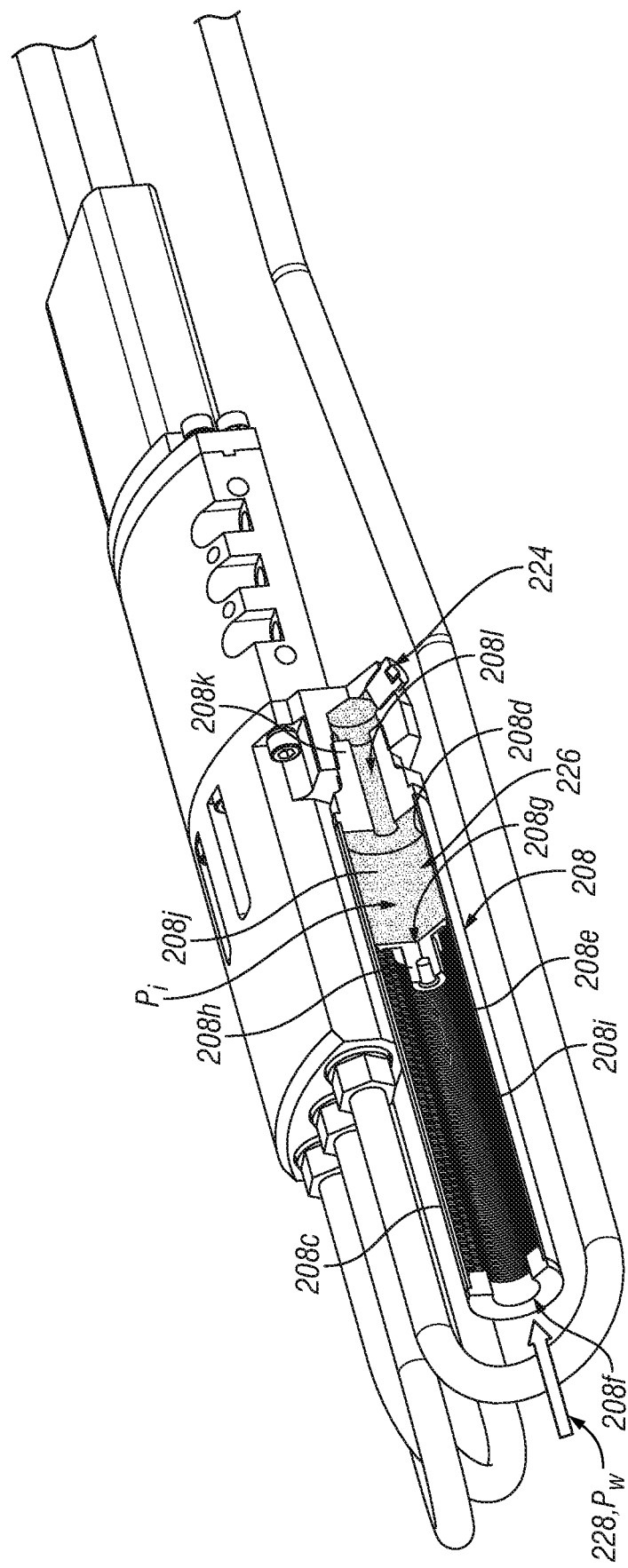
FIG. 24 shows the wet mate connector of FIG. 23 in partial sectional view along the bellows/accumulator system.
Figure 25:
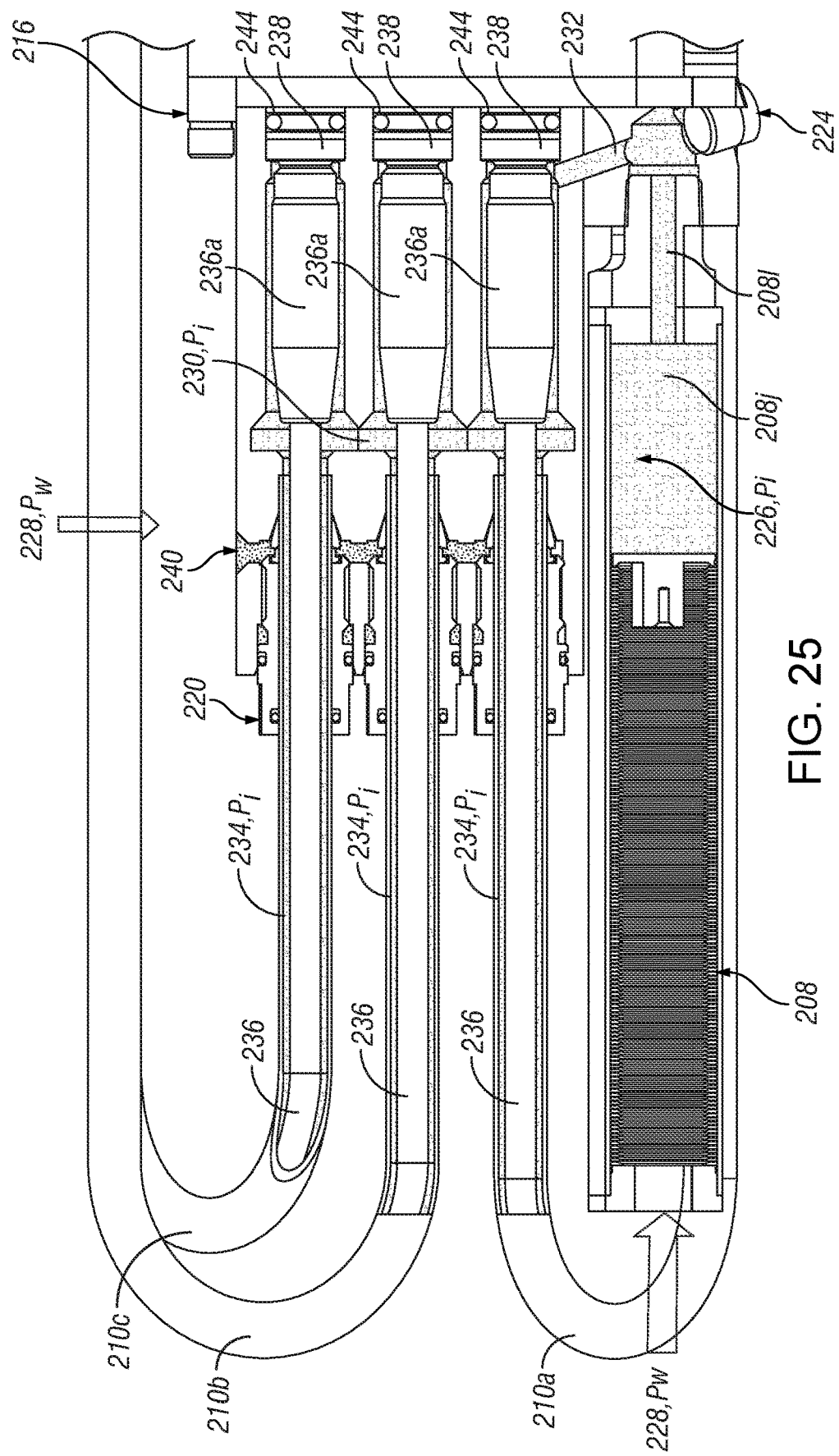
FIG. 25 is an enlarged plan view in partial sectional view of the wet mate connector taken along lines 25-25 of FIG. 12.
Figure 26:
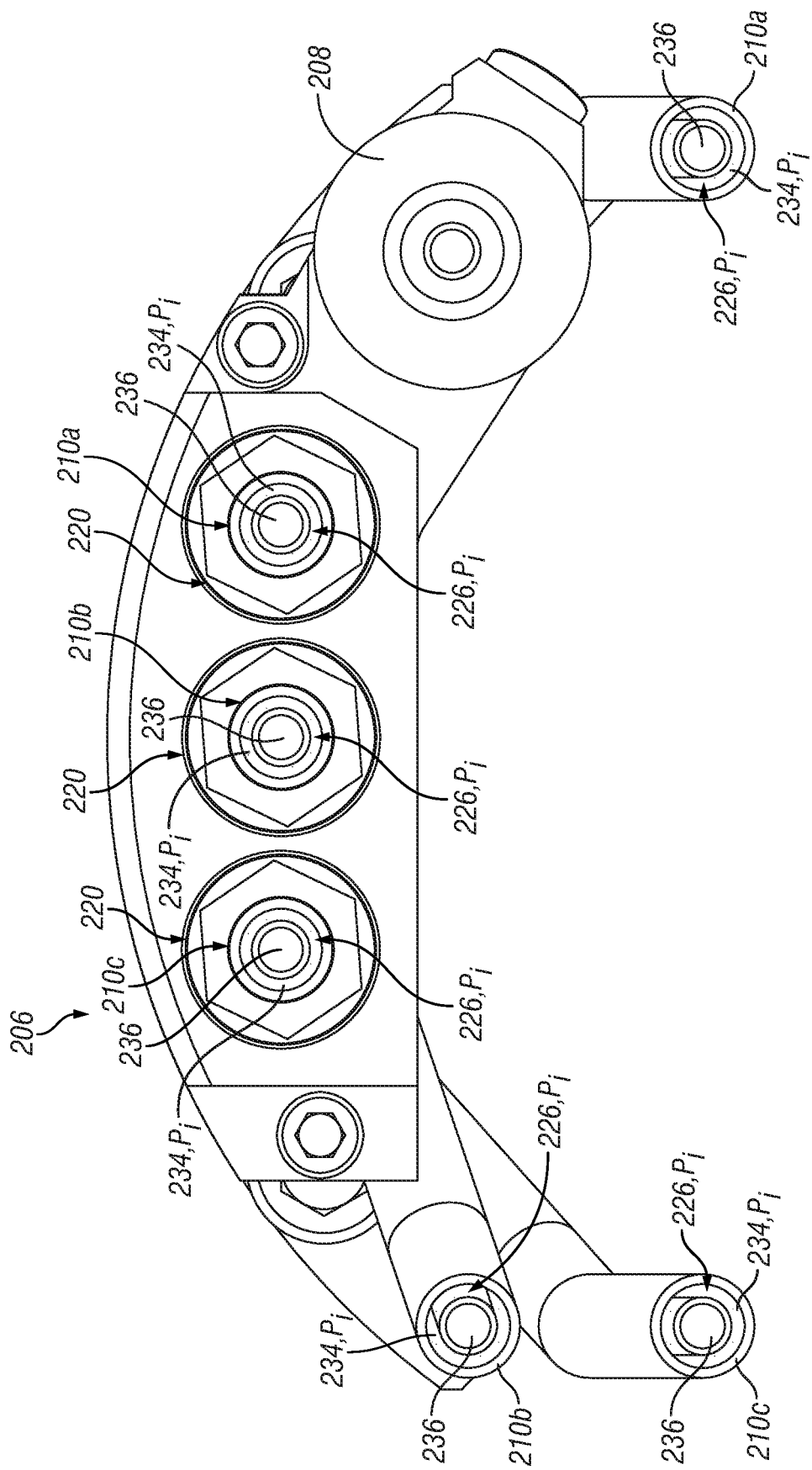
FIG. 26 is an end cross-sectional view of the wet mate connector taken along lines 26-26 of FIG. 23.

(4) Electrical testing through a fusible link incorporated into the permanent downhole connector (e.g., FIGS. 23-25).

All four test methods can be implemented for the though tubing ESP applications. These methods (and associated structural components) are discussed below.

Figure 1:
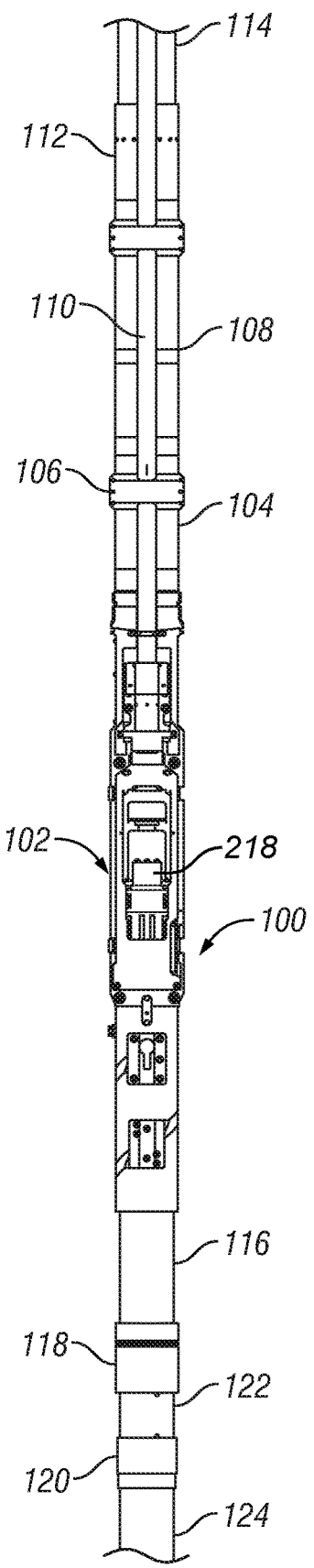
FIG. 1 is a plan view of a partial length of an exemplary permanent completion portion of a production tubing assembly.

FIG. 1 illustrates a portion of a production tubing string assembly 100 comprising upper production tubing section 114 which leads to surface (not shown) and a lower production tubing section 124. This is a general view of a typical production tubing installation 100 of the permanent completion section of a retrievable ESP system. Production tubing 100 further comprises an annular connection port (ACP) section 102 connected between the upper and lower production tubing strings (114, 124). The ACP 102 annular connection port top level assembly employs a side pocket style wet connector system. An ESP cable 110 runs down the production tubing assembly 100 from the surface to the ACP. The ESP cable 110 could be any style cable known in the art, including one or more individually protected cable or cables embedded within a cable housing. A gas venting coupling 112 is employed to allow gas build-up from ESP system to escape to the annulus. A shroud joint 104 is provided for retrievable components of a retrievable ESP system. A cable protector split clamp 106 is provided to fix and protect ESP and other cables going down the assembly. A centralizer coupling 108 is shown. A spacer joint 116 is shown to provide spacing for a B-profile coupling 118, a coupling with an internal B-profile to release the alignment pin on a retrievable system. A no-go coupling 120 is shown, and serves as a coupling with an undersized ID to provide a hard-stop for depth indication. Another spacer joint 122 spaces the no-go coupling 120 from the B-profile coupling 118.

Figure 2:
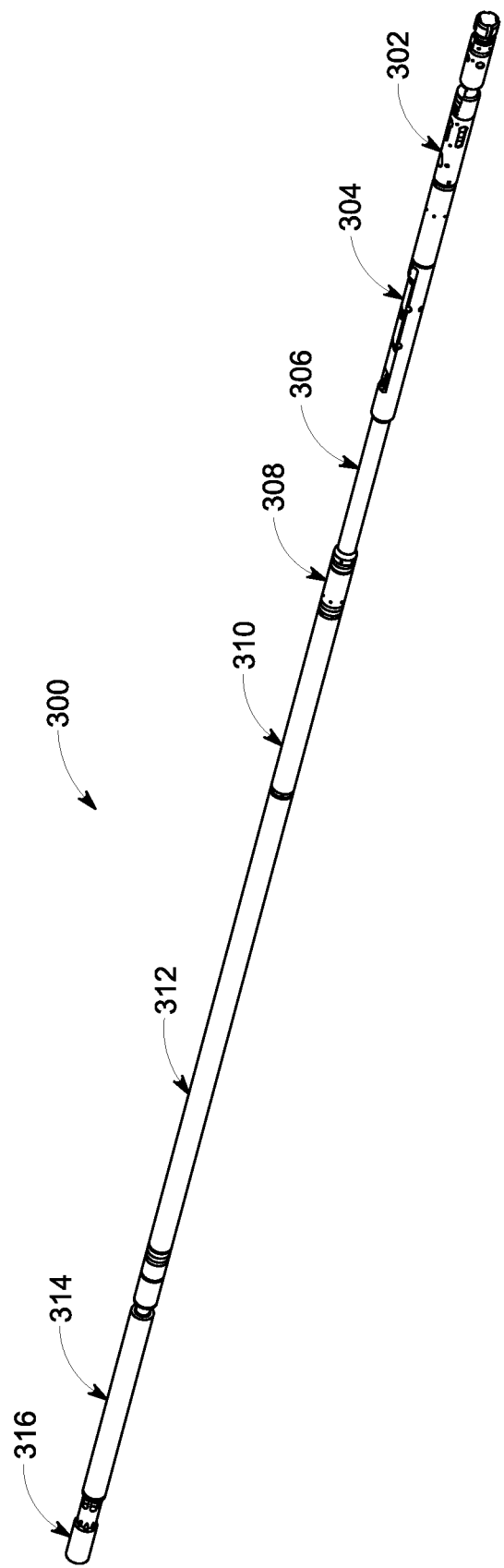
FIG. 2 is a perspective view generally depicting an exemplary standard retrievable ESP assembly.

FIG. 2 generally depicts an exemplary standard retrievable ESP assembly 300 comprising at one end a lower mating unit 316 for forming a retrievable system to pump connection. An industry standard motor protector/seal section 314 is provided adjacent to the lower mating unit 316 between the motor 312, such as a permanent magnet motor (PMM) or other suitable motor (e.g., brushless electrical motor), and a downhole sensor system 310 connected adjacent to the PMM for downhole wellbore fluid pressure, temperature and motor winding temperature and motor vibration measurement. A pressure balancing and connector section 308 (pressure balance assembly) is provided to connect the motor and sensor system to the plug arm assembly 306 (e.g., to a pressure compensated female connector system), which is in turn connected to the plug head assembly 304 (or female connector assembly). A plug arm orienting section 302 is provided and includes the retrievable system orienting pin, the plug head release mechanism and the emergency release.

Figure 3:
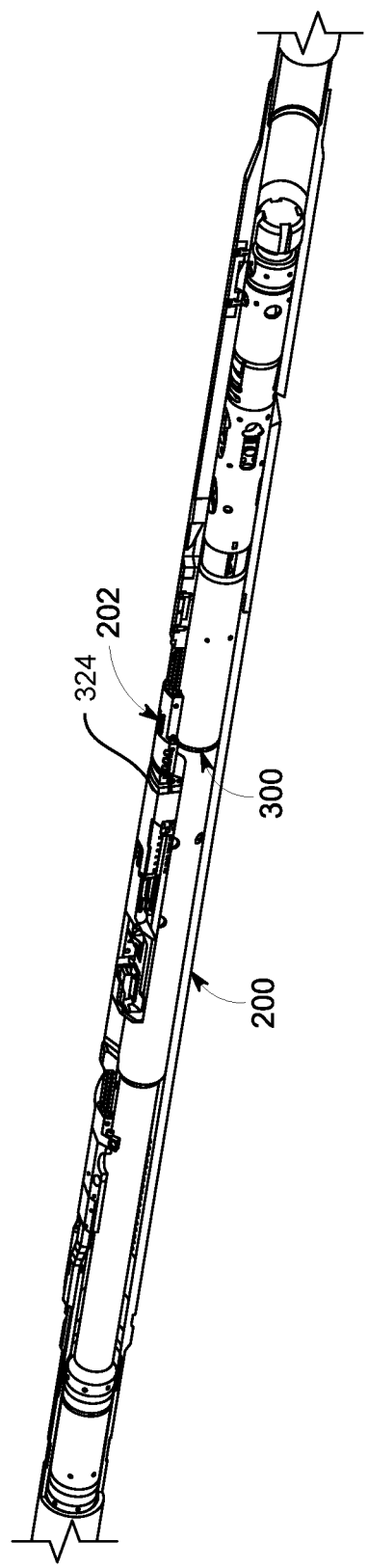
FIG. 3 is a perspective cut-away view of a partial length of an exemplary permanent completion portion of a production tubing assembly shown with a standard retrievable ESP assembly connected to the annular connection port (also referred to herein as an ACP) connection section via a permanent downhole electrical connector assembly.

FIG. 3 depicts a partial length of a permanent completion portion of a production tubing assembly shown with a retrievable ESP assembly 300 connected to the permanent downhole ACP connector section 200 via connecting the test female connector assembly 324 of the ESP assembly to a permanent downhole electrical connector assembly 202 of the ACP according to an embodiment of the present disclosure.

Figure 4:
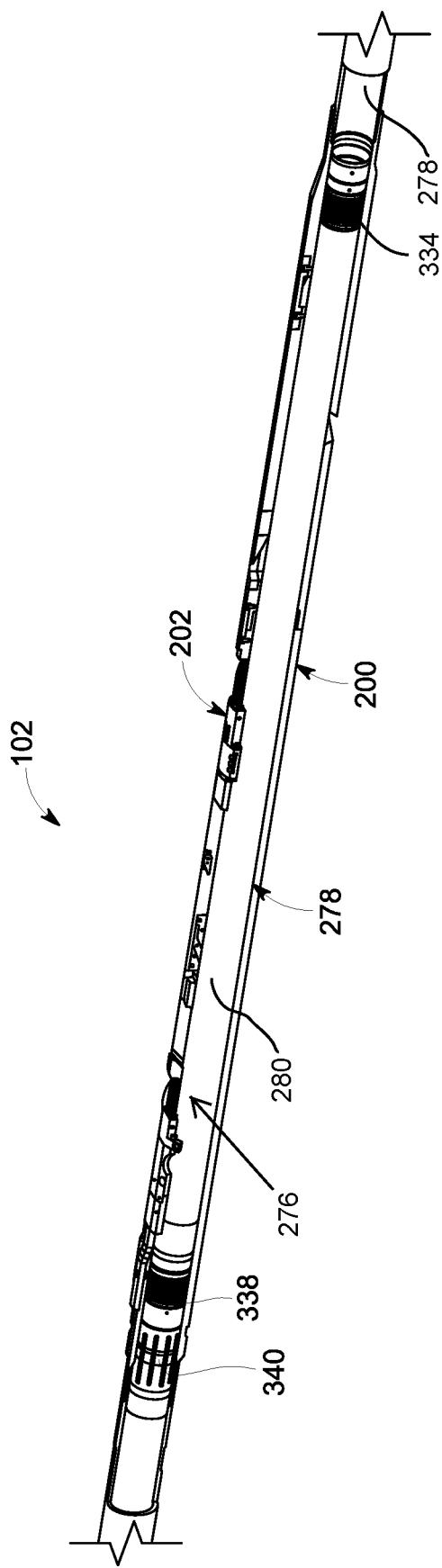
FIG. 4 is a perspective cut-away view of a partial length of an exemplary permanent completion portion of a production tubing assembly shown with a standard pressure isolation sleeve assembly installed therein.

FIG. 4 depicts a partial length of an exemplary permanent completion portion of a production tubing assembly shown with a standard pressure isolation sleeve assembly 276 installed within the ACP 102. Isolation sleeve 276 may be deployed and latched into the ACP 102 using a latching mechanism 340, such as a collet and latching profile, and allow full working pressure and the largest available inner diameter of inner bore 278 for fluid flow within production tubing. Isolation sleeve 276 may be deployed into the ACP 102 and may be landed on a tail pipe section connected below the permanent downhole electrical connector assembly or wet connect mandrel (WCM) 202. For example, in typical configurations the WCM is characterized by a main tubular body 280 having an inner bore of a desired inner diameter, for example, in one embodiment having a 4½" inner diameter. According to certain embodiments, isolation sleeve 276 is characterized by a main tubular body 280 with an inner bore having a 3.1" inner diameter and approximately a length of 10 feet, while being pressure rated for up to 10,000 psi. The isolation sleeve 276 latching mechanism 340 is capable of latching with the WCM latching profile so that the upper and lower seals 338, 334 on the outer surface of the isolation sleeve are positioned and capable of forming a seal between the upper seal 338 and the smooth bore in the upper sealing section of the bore 278 and between the lower seal 334 and the smooth bore of the lower sealing section of the bore 278, the seals 338, 334 being positioned on the isolation sleeve 267 to permit sealing of the inlet section of the WCM to prevent passage of fluid through the inlet section when the isolation sleeve 276 is present and secured within the wet connect mandrel bore 278.

Figure 5A:
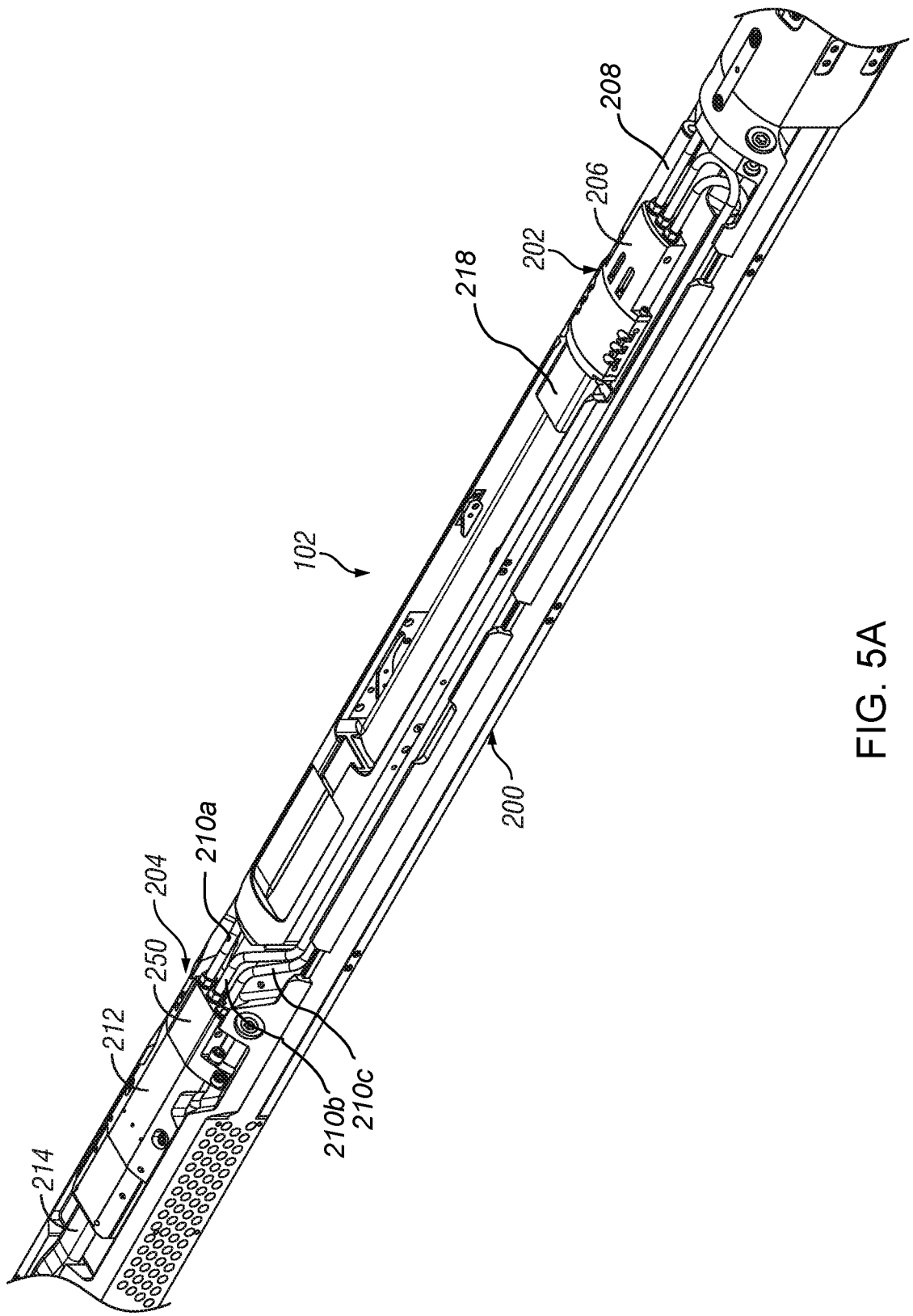
FIG. 5A shows a perspective enlarged view of an ACP connection section (such as in FIG. 3) without any retrievable ESP system connected therein.
Figure 5B:
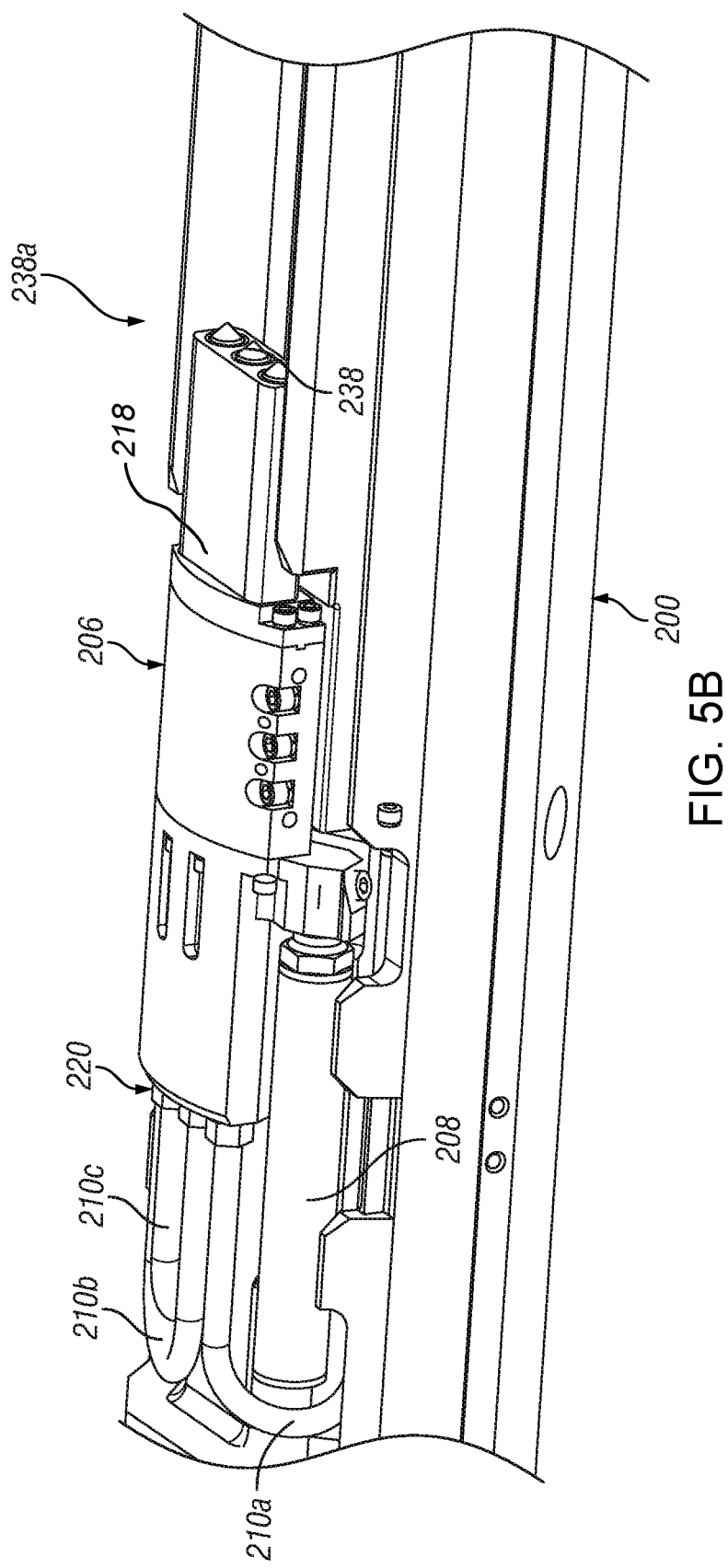
FIG. 5B is another enlarged view of the ACP of FIG. 3 showing the wet mate connector and bellows compensator according to an embodiment of the present disclosure.
Figure 6:
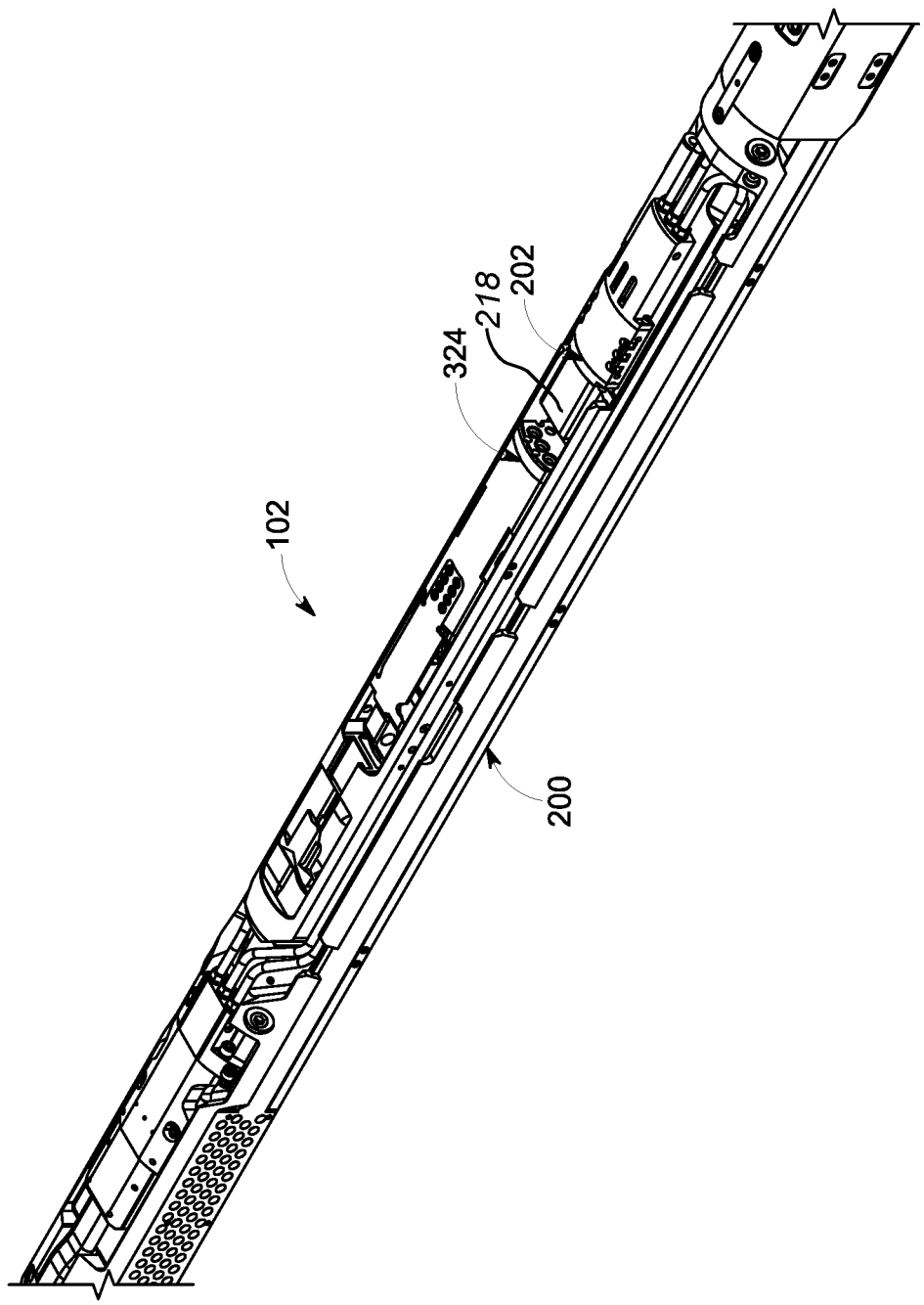
FIG. 6 shows the ACP connection section of FIG. 5A with a retrievable ESP system therein just prior to the retrievable ESP system being connected.
Figure 7:
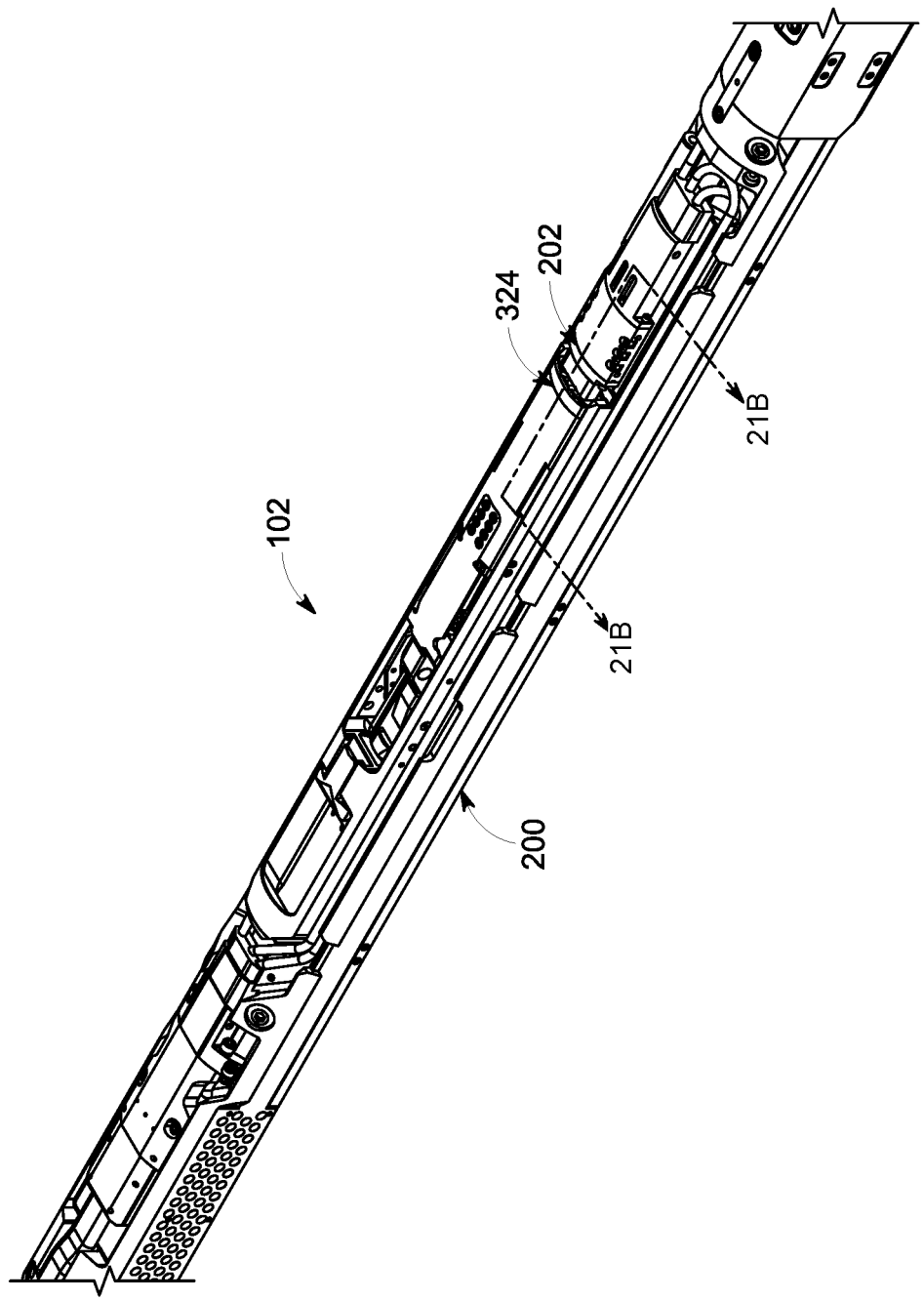
FIG. 7 shows the ACP connection section of FIG. 6 with the retrievable ESP system plug head connected made therein.
Figure 8:
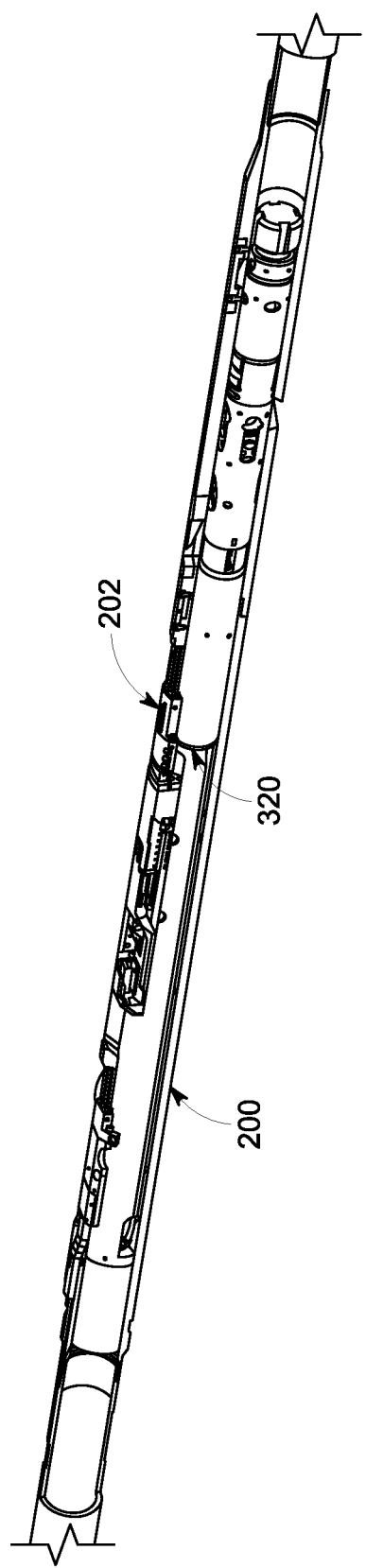
FIG. 8 is a perspective cut-away view of a partial length of a permanent completion portion of a production tubing assembly shown with a custom-built retrievable test plug arm assembly (without pressure isolation) connected to the permanent downhole ACP connector section via a permanent downhole electrical connector assembly according to an embodiment of the present disclosure.
Figure 9:
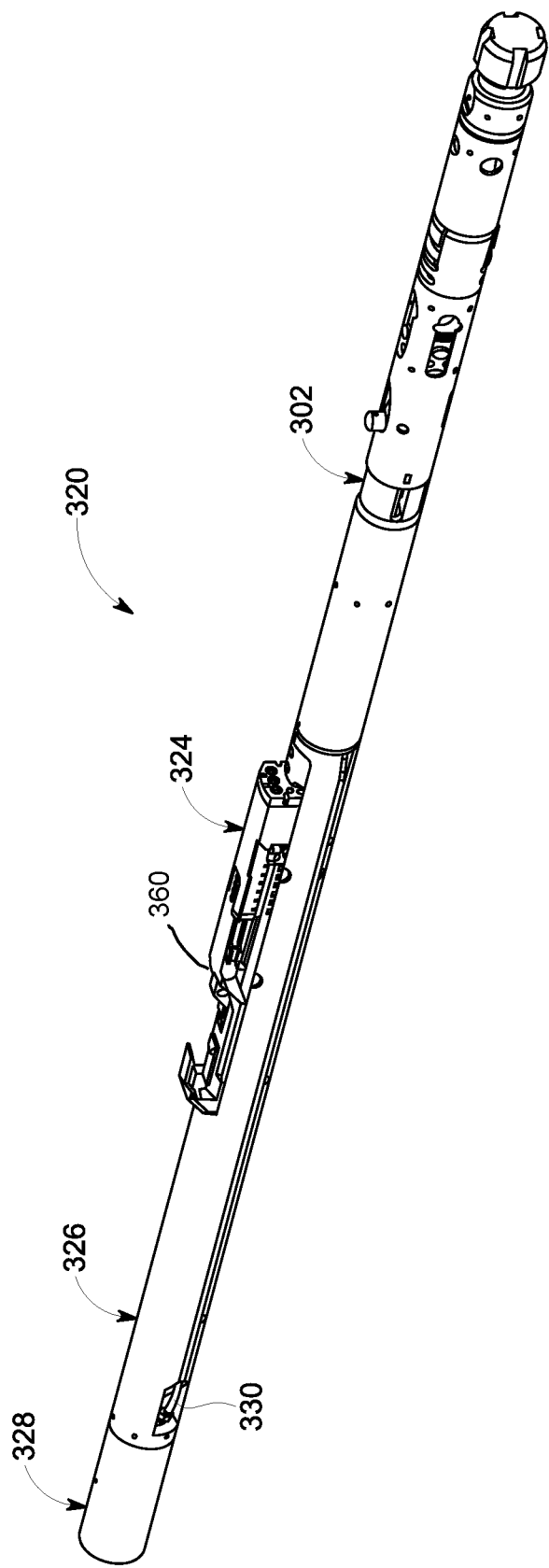
FIG. 9 is a perspective view of the custom-built retrievable test plug arm assembly (without pressure isolation) as in FIG. 8 according to an embodiment of the present disclosure.

Referring now also to FIGS. 5-7, there is shown an ACP connector section 200 in the ACP 102, such as that disclosed in U.S. Pat. No. 11,105,160. Housed within the ACP connector section 200 is the permanent downhole electrical connector assembly 202. This assembly 202 further comprises a field connector assembly/receptacle 204 (with housing 250) at one end and a wet mate connector 206 (with electrode housing 218) interconnected by one or more tubing enclosed leads/cables 210 (210a, 210b, 210c) (wire inside of a tube)(e.g., TEC, etc. known in the art). The electrical connector assembly 202 further comprises a bellows/accumulator system 208 shown here attached as part of the wet mate connector 206.

The completion tubing 102 further comprises a field connector plug 212 capable of receiving the field connector receptacle 204 end of the permanent downhole electrical connector assembly 202 to complete an electrical connection between the ACP connector system 200 and the ESP cable 110 on the upper production tubing section 114. The power lead cable 214 can extend up to the surface or to other part of the tubing string, e.g., cable 110 in FIG. 1. Cable 214 can be for power, signal, or other control line wire to surface. FIG. 5 shows the ACP connection section 200 without any ESP retrievable system 300 therein. FIG. 6 shows the ACP connection section 200 with an ESP retrievable system therein just prior to being connected, and FIG. 7 shows the connection made as in FIG. 3.

Option 1: Existing Method of Electrical Testing with the Retrievable Assembly Installed Referring again to FIG. 3, currently, a method of monitoring cable integrity and motor condition may be performed during the permanent completion installation using the standard retrievable ESP system 300. Referring again to FIG. 2, there is shown a retrievable ESP assembly 300 connected to the permanent downhole ACP connector section 200 via permanent downhole electrical connector assembly 202. The retrievable assembly is connected to the permanent downhole connector while the permanent completion is still close to the surface (usually at depths up to 1000 ft) and both completions are deployed to the desired depth. During the run in hole (RIH), electrical measurements (conductor resistance and insulation resistance) are taken every 500-1000 ft until the final depth is reached. In a majority of cases, at this point the system is commissioned and it becomes operational shortly thereafter. In other cases, where the pump operation is planned for a later date, the retrievable assembly 300 is disconnected from the permanent downhole connector 200 and removed from the well. When the retrievable assembly is disconnected, the ESP cable conductor resistance cannot be measured any longer.

This embodiment provides for an electrical testing method for a through tubing deployed ESP. It further provides for monitoring of the ESP cable conductor continuity/resistance and permanent downhole connector system insulation resistance while RIH, using the retrievable system 300. Additionally, this method provides for testing of the mechanical latching of the retrievable system 300 onto the permanent completion close to surface or at depth. In this embodiment, the ESP system may be wireline deployable. This testing method does not require additional changes to be made to the permanent completion and is thus compatible with existing permanent completions.

Option 2: Electrical Testing with a Custom Test Plug Arm Installed

For applications where the retrievable assembly with ESP motor may need to be installed at a later date, a custom-built retrievable plug arm assembly is disclosed for performing the electrical testing of the permanent completion during RIH (in place of the standard retrievable ESP assembly 300). This tool is a simplified version of the retrievable completion, incorporating a customized, oil filled, pressure compensated plug head assembly. The motor is not included in this custom plug arm assembly; therefore, the plug head comprises the common connection between all three phases (star point). The custom plug arm assembly can be further tailored into two variants: without or with pressure isolation of the permanent downhole wet connector.

Figure 10:
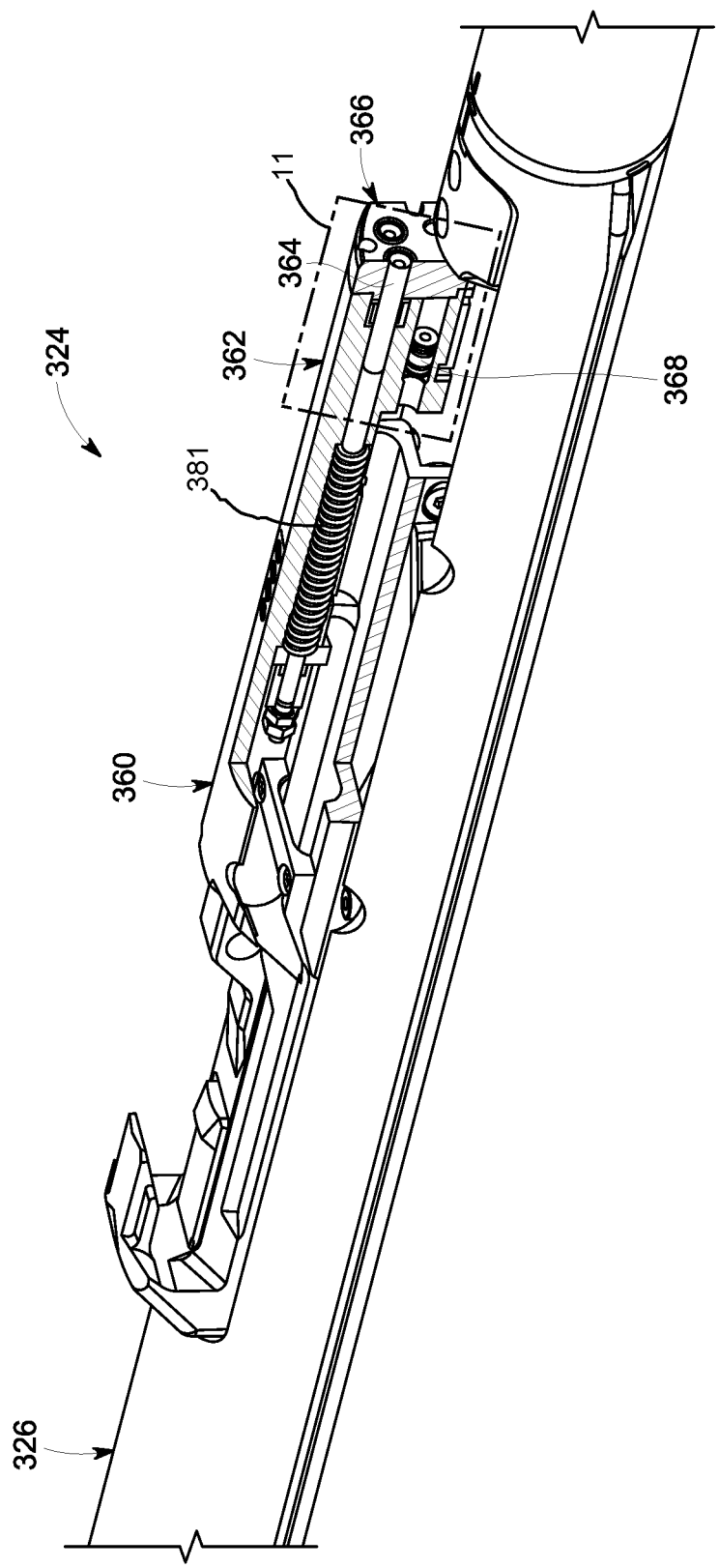
FIG. 10 is a close up, partial sectional view of the custom-built retrievable test plug arm assembly (without pressure isolation) shown in FIG. 9.
Figure 11:
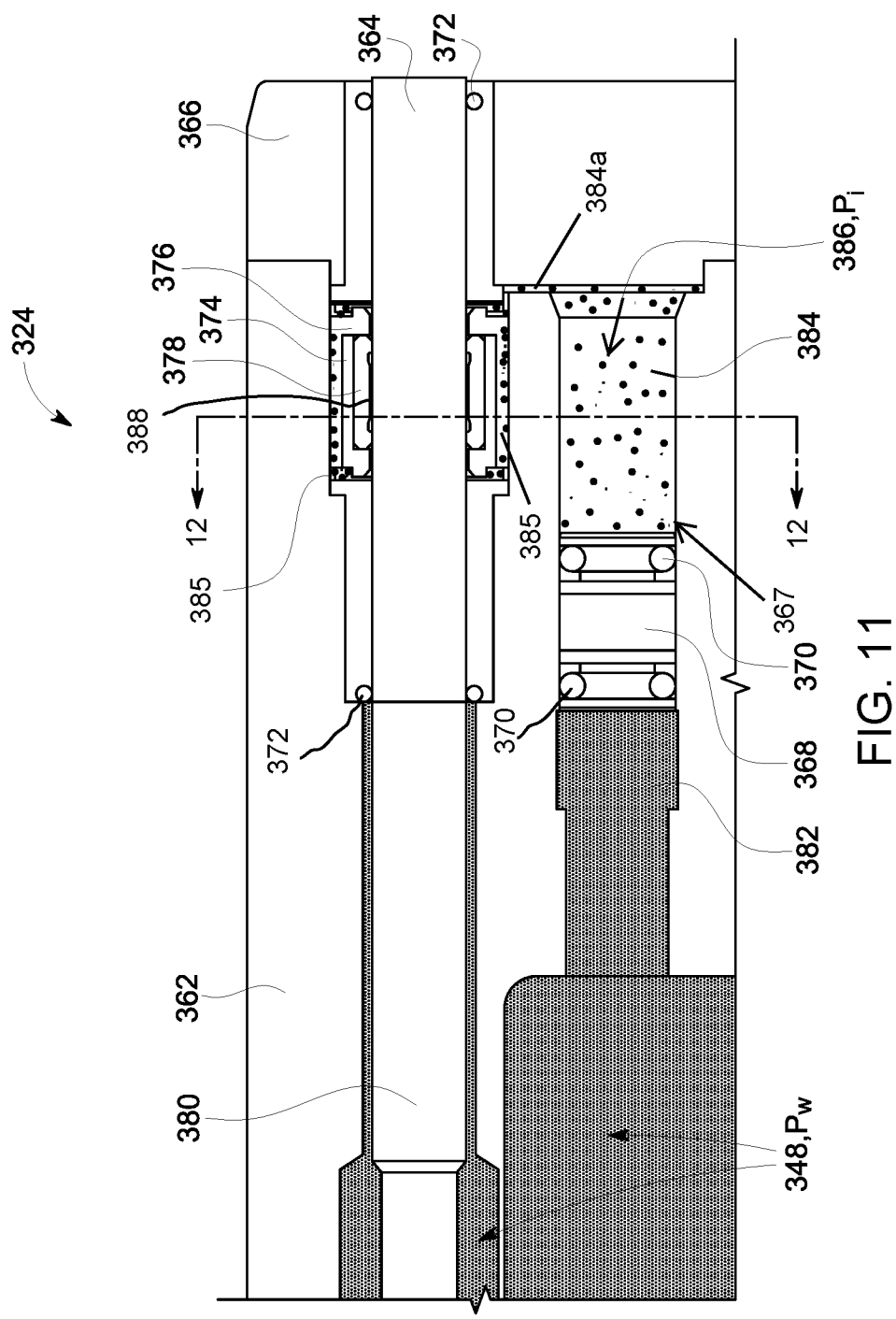
FIG. 11 is a close up plan cross-sectional view taken from area 11 of FIG. 10.
Figure 12:
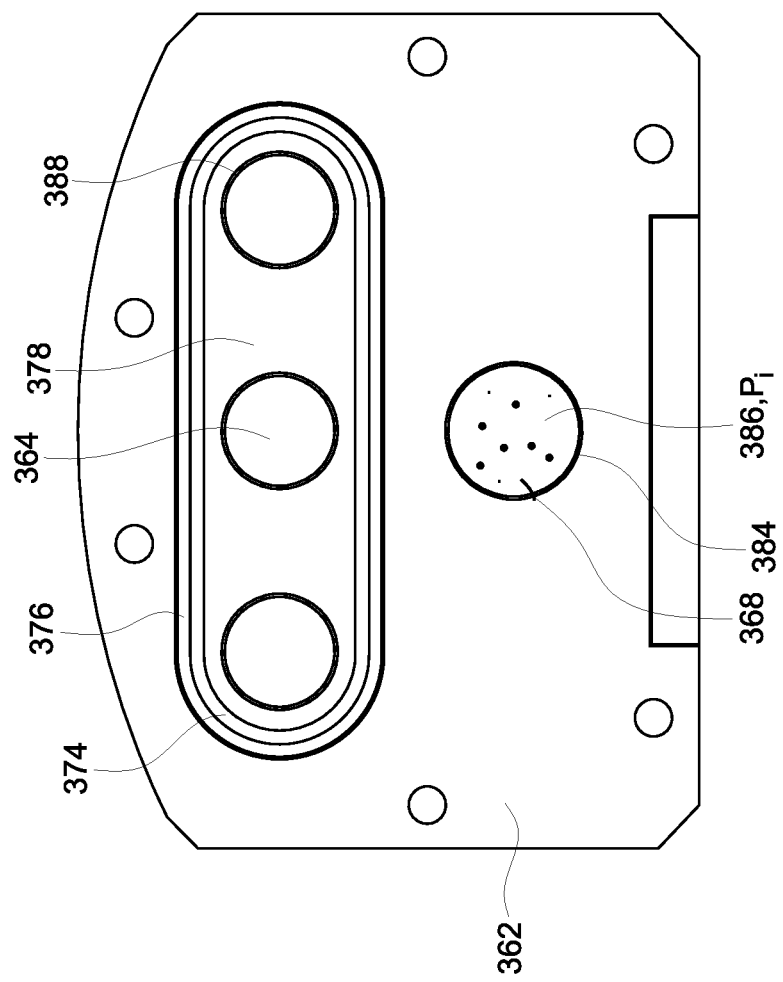
FIG. 12 is a cross-sectional view taken along lines 12-12 of FIG. 11.
Figure 13:
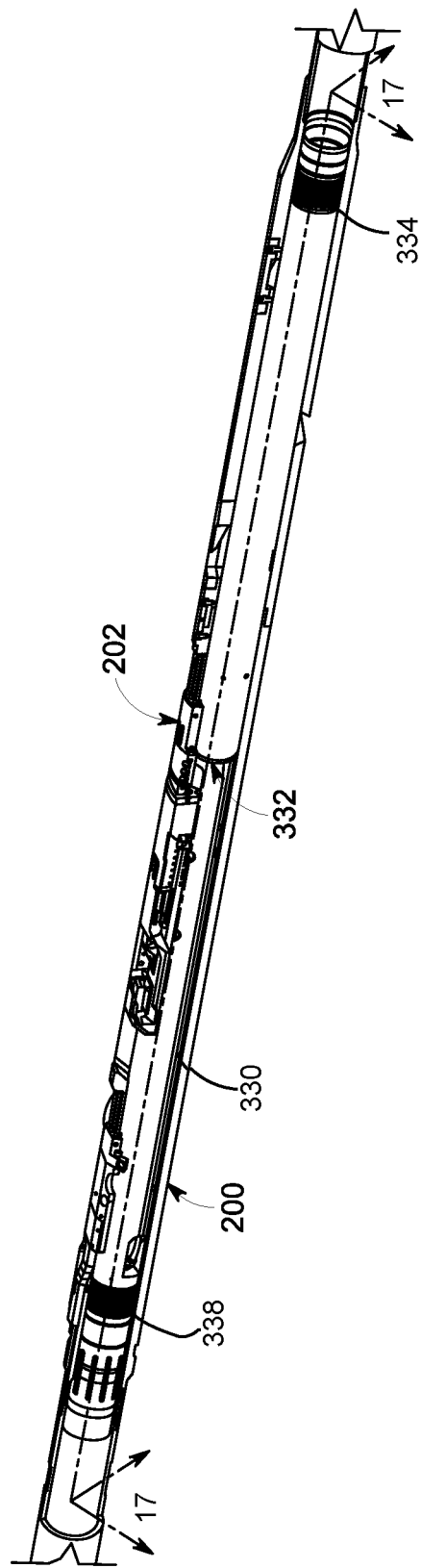
FIG. 13 is a perspective cut-away view of a partial length of a permanent completion portion of a production tubing assembly shown with a custom-built retrievable test plug arm assembly (with pressure isolation) connected to the permanent downhole ACP connector section via a permanent downhole electrical connector assembly according to an embodiment of the present disclosure.
Figure 14:
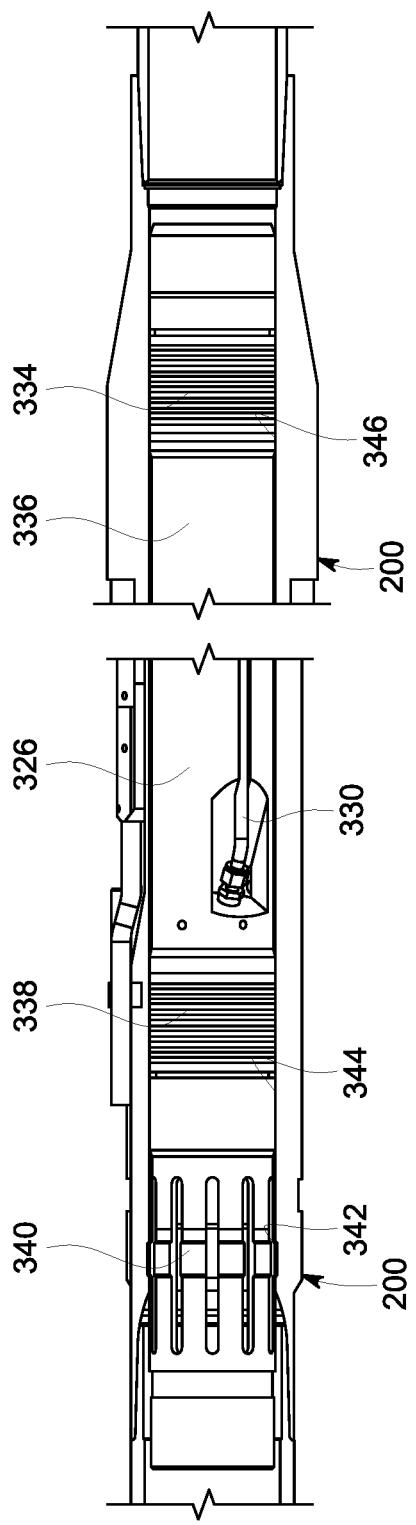
FIG. 14 shows an enlarged view of the ends of the custom-built retrievable test plug arm assembly (with pressure isolation) of FIG. 13 according to an embodiment of the present disclosure.
Figure 15:
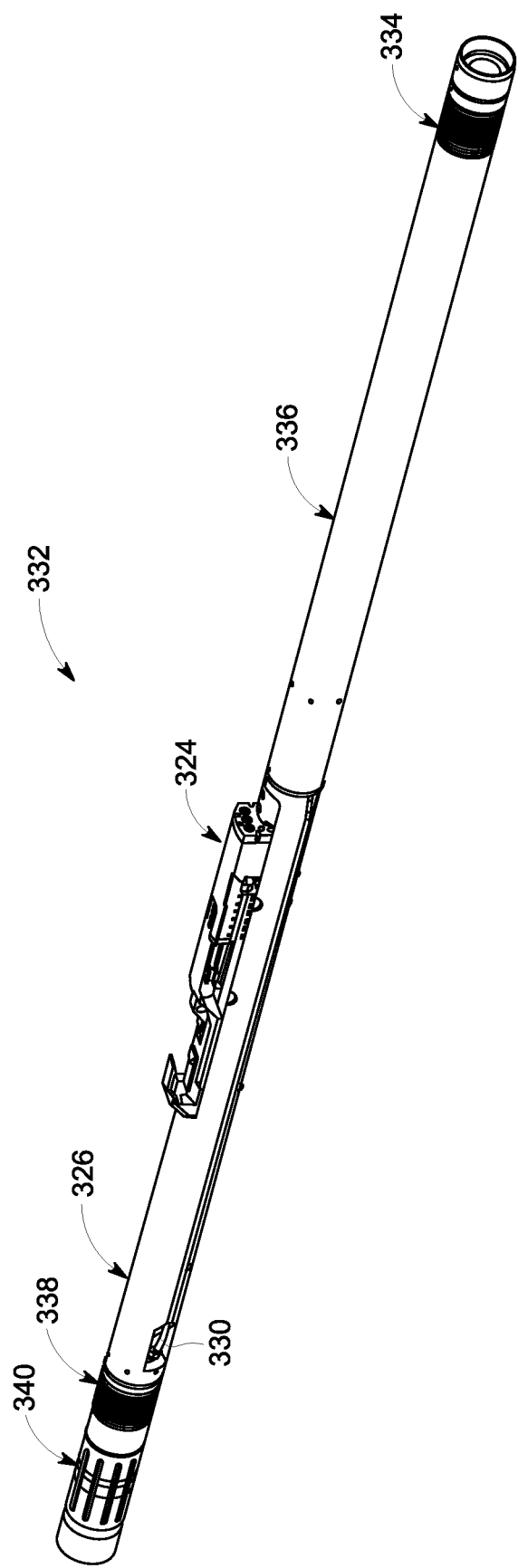
FIG. 15 is a perspective view of the custom-built retrievable test plug arm assembly (with pressure isolation) as in FIG. 13 according to an embodiment of the present disclosure.
Figure 16:
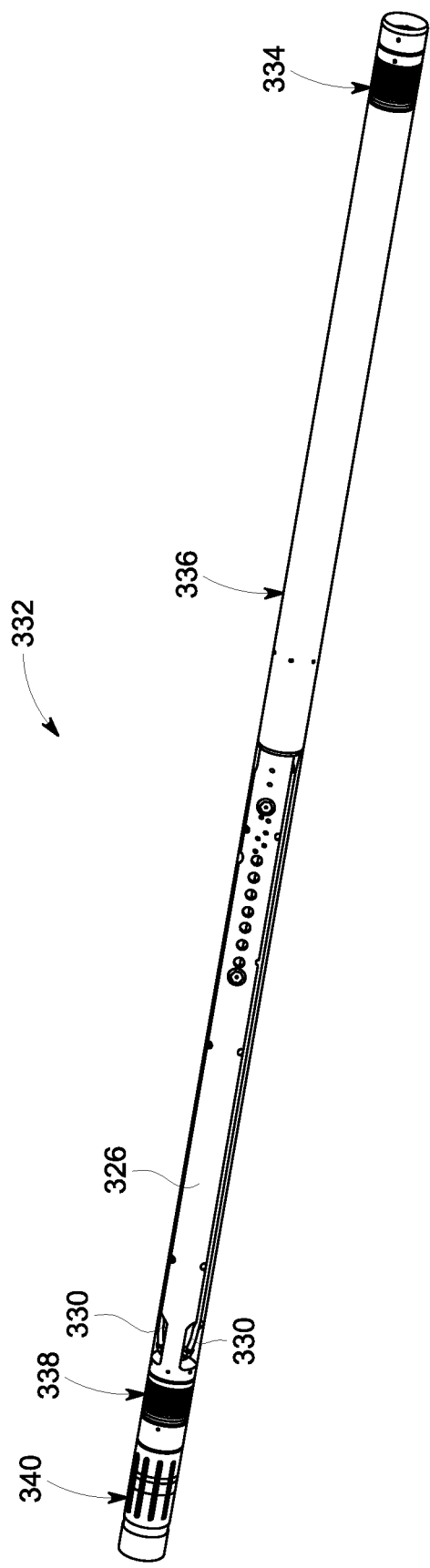
FIG. 16 is a perspective view of the custom-built retrievable test plug arm assembly (with pressure isolation) as in FIG. 13 according to an embodiment of the present disclosure.
Figure 17:
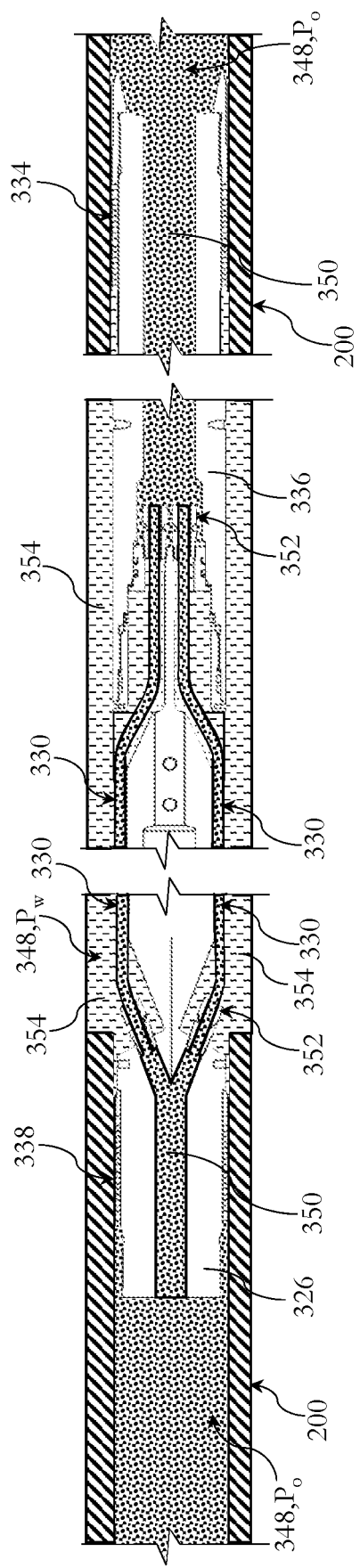
FIG. 17 depicts cross-sectional segments along the length of the custom-built retrievable test plug arm assembly (with pressure isolation) taken along lines 17-17 of FIG. 13.

Custom test plug arm without pressure isolation of the permanent downhole wet connector. Referring now to FIGS. 8-12 and 22A, 22B (in connection with the discussion of FIGS. 2-7), for applications where the retrievable assembly 300 with ESP motor 312 may need to be installed at a later date, a custom-built retrievable plug arm assembly 320 is disclosed for performing the electrical testing of the permanent completion during RIH (in place of the standard retrievable ESP assembly 300) without pressure isolation. The customized plug arm assembly 320 (FIG. 9) is a simplified version of the retrievable assembly 300 (FIG. 3) that incorporates a customized, oil filled, and pressure compensated plug head assembly 324. A motor is not installed in this custom plug arm assembly 320, therefore the plug head comprises the common connection between all three phases (star point)(as discussed further below). FIG. 10 depicts the custom-built retrievable test plug arm assembly 324 shown in FIG. 9. FIG. 11 depicts close up area 11 of FIG. 10. FIG. 12 is a cross-sectional view taken along lines 12-12 of FIG. 11. FIG. 22A shows a top view of a connector system employing a bellows accumulator 208 (with some partial cross-sectional views) with starpoint connection shown in a disconnected state just prior to being connected to, e.g., a custom-built retrievable test plug arm assembly 324. FIG. 22B shows a top view of the connector system of FIG. 22A (with some partial cross-sectional views) such as generally shown in lines 21B-21B of FIG. 7 with the starpoint connection shown in a connected state after being connected to a custom-built retrievable test plug arm assembly 324.

The custom-built retrievable plug arm assembly 320 generally comprises a test plug arm body 326, plug arm assembly hook 360 (serving as a mounting hook for the plug arm assembly), test female connector main body 362, plug arm front plate 366, test plug arm collar 328, a test female connector assembly 324, and a plug arm orienting section 302. The plug arm front plate 336 is outfitted with female connector sockets 364 that are protected with spring loaded retractable pins 380 (with springs 381) which serve to protect the female contact block 378 of the female wet connect. A bypass line 330 extends along the test plug arm body 326. When using the custom plug arm assembly 320 without pressure isolation, the orienting section/motor guide 302 and standard (e.g., 4.0") finishing neck are connected to the plug arm, thus making this unit wireline deployable. When deployed inside the annular connection port (ACP) and connected to the permanent downhole wet mate connector, wellbore fluid will completely cover the plug arm and the permanent downhole wet connector. The cable continuity/conductor resistance between two phases and the cable insulation resistance of all phases can be monitored during installation. The custom plug arm assembly can be removed using standard wireline equipment.

The custom-built retrievable female test plug arm assembly 324 is capable of receiving the wet mate connector electrode(s) (permanent downhole connector electrode(s)) 238 on the permanent downhole connector assembly 202. Each electrode 238 has an electrode contact area 270 which provides the electrical connection to the corresponding female connector electrical contact band 388 once the connection is made. In a typical example, the wet mate connector will have three electrodes, each of which will be received into a corresponding female connection socket 364 extending inwardly into the connector main body 362 through the plug arm front plate 366. The wet mate connector electrode 238 is a permanent downhole electrical connector wet mate electrode, which connects with 324 (Plug head) during downhole deployment. The wet mate connector electrode cone end 238*a* is a self-centering connection end of the wet mate connector electrode 238, and provides a first area of contact between wet mate connector electrode 238 and the female connector socket 364.

Female connector socket seals or sealing elements (such as O-ring seals) 372 provide sealing of the test plug head female connector sockets 364 from, e.g., wellbore fluid 348, which has a well bore hydrostatic pressure $P_w$, e.g., the downhole pressure generated by the column of fluid above the permanent downhole connector system.

The test female connector main body 362 is a custom designed main housing for the female downhole wet connect, for the contact block 378 (star point) and for a self-contained pressure balance and oil expansion compensator. Spring-loaded pistons or retractable pins 380 occupy the female connection socket area (as sealed by seals 372) when the custom-built retrievable female test plug arm assembly 324 is in its disconnected state and are maintained in place by the force of springs 381. When the custom-built retrievable female test plug arm assembly 324 is connected to the permanent downhole electrical connector assembly 202, the corresponding wet mate connector electrode(s) 238 on the permanent downhole connector assembly 202 move the corresponding spring-loaded pins 380 inwardly to permit the electrode contact area 270 to make contact with the contact band 388 located within the starpoint connection block 378.

The starpoint connection block 378 comprises female connection sockets 364 extending therethrough, one for each electrode, three being shown here. Lining or partially lining the connection sockets of the starpoint connection block 378 are cylindrical electrode contact bands 388 positioned such that when the wet met electrodes 238 are connected therein, the electrode contact band 270 is aligned with the corresponding starpoint block electrode contact bands. The starpoint contact block is surrounded by a contact block inner insulator 374 and outer insulator 376, installed in an overlapping fashion. The starpoint contact block 378 and insulation layers 374, 376 are contained within a starpoint contact block chamber 385 located within the test female connector main body 364.

The starpoint contact block inner chamber 385 is filled with a dielectric fluid 386 maintained at a compensated pressure $P_i$ through the action of a test plug head compensator system 367. The test plug head compensator system 367 comprises a cylindrical chamber having a first end 382 exposed to wellbore fluid at pressure $P_w$, and a second end 384 comprising a compensator piston inner cylindrical chamber filled with dielectric fluid 386 at a compensated pressure $P_i$. The inner cylindrical chamber 384 second end is in fluid communication (via passage 384a) with the starpoint contact block inner chamber 385. Contained within the test plug head compensator system cylinder, between ends 384 and 384 is a test plug head compensator piston 368 having seals (e.g., O-ring seals) at opposed ends to prevent intrusion of wellbore fluid 348 from entering chamber 384 (and to maintain the dielectric fluid within chamber 384). As wellbore fluid pressure $P_w$ increases, the piston 368 is urged toward the second end 384 thereby increasing the dielectric fluid pressure Pi at a pressure greater than the wellbore fluid pressure to prevent wellbore fluid intrusion into the area of the electrical contact band 388. As will be understood from the drawings, the dielectric fluid also resides around the retractable pin (as sealed by seals 372) and the compensated dielectric fluid pressure also serves to prevent wellbore intrusion across seals 372.

Custom test plug arm with pressure isolation of the permanent downhole wet connector. Referring now to FIGS. 13-17 in connection with the prior figures, there is shown a custom test plug arm assembly 332 used with pressure isolation of the permanent downhole wet connector.

The custom plug arm with the pressure isolation (FIG. 13) is mainly used in an inline permanent completion flow configuration, for example to set a packer below the ESP. The custom plug arm provides high pressures sealing inside the connection port, below and above of the permanent downhole wet connector. The sealing is achieved using packing stacks 338, 334 installed on the custom plug arm assembly. The ACP collet profile polished bore 342 is proximate the position of the collet latch 340. The ACP upper polished bore 344 provides a surface for sealing with the upper packing seal 338. The ACP lower polished bore 346 provides a surface for sealing with the lower packing seal 334. The upper isolation packing or seal 338 is installed on the upper end of the body 326 followed by the collet latch. A lower isolation packing spacer tube 336 is installed to the lower end of the test female connector assembly 324, and the lower isolation packing or seal 334 is attached to the end of the spacer tube 336 at the lower end of the test plug arm assembly 332. These seal in both existing polished bores of the connection port (ACP) 102. The well bore fluid communication across the custom plug arm assembly is achieved through bypass lines 330. No fluid can enter the permanent downhole wet connector area. The installation of this plug arm configuration must be performed in the workshop or at surface prior to RIH of the permanent completion. When installed and RIH, the well bore fluid 348 is typically at an over pressure $P_o$, e.g., the well bore pressure when hydraulic pressure is applied from surface to operate downhole equipment. The well bore over pressure is usually higher than the hydrostatic pressure $P_w$. In this embodiment, well bore fluid 348 is permitted to flow into a bypass fluid path 350 and then into via bypass lines 330 connected to the bypass fluid path by, e.g., Swagelok type tube fittings 352. The seals 338, 334 create an isolated well bore fluid path 354 containing well bore fluid 348 at pressure $P_w$. The cable continuity/conductor resistance between two phases and the cable insulation resistance of all phases can be monitored during installation. The custom plug arm assembly 332 can be removed using standard wireline equipment.

Option 3: Electrical Testing Through a Built in Star-Point in the Permanent Downhole Wet Mate Connector Testing of the permanent downhole connector electrical system can be also achieved without the use of a retrievable tool, such as a retrievable ESP or a custom retrievable test plug arm installed with or without pressure isolation as described above. In this case, only the condition of the ESP cable and the permanent downhole connector electrical system can be monitored.

Figure 18:
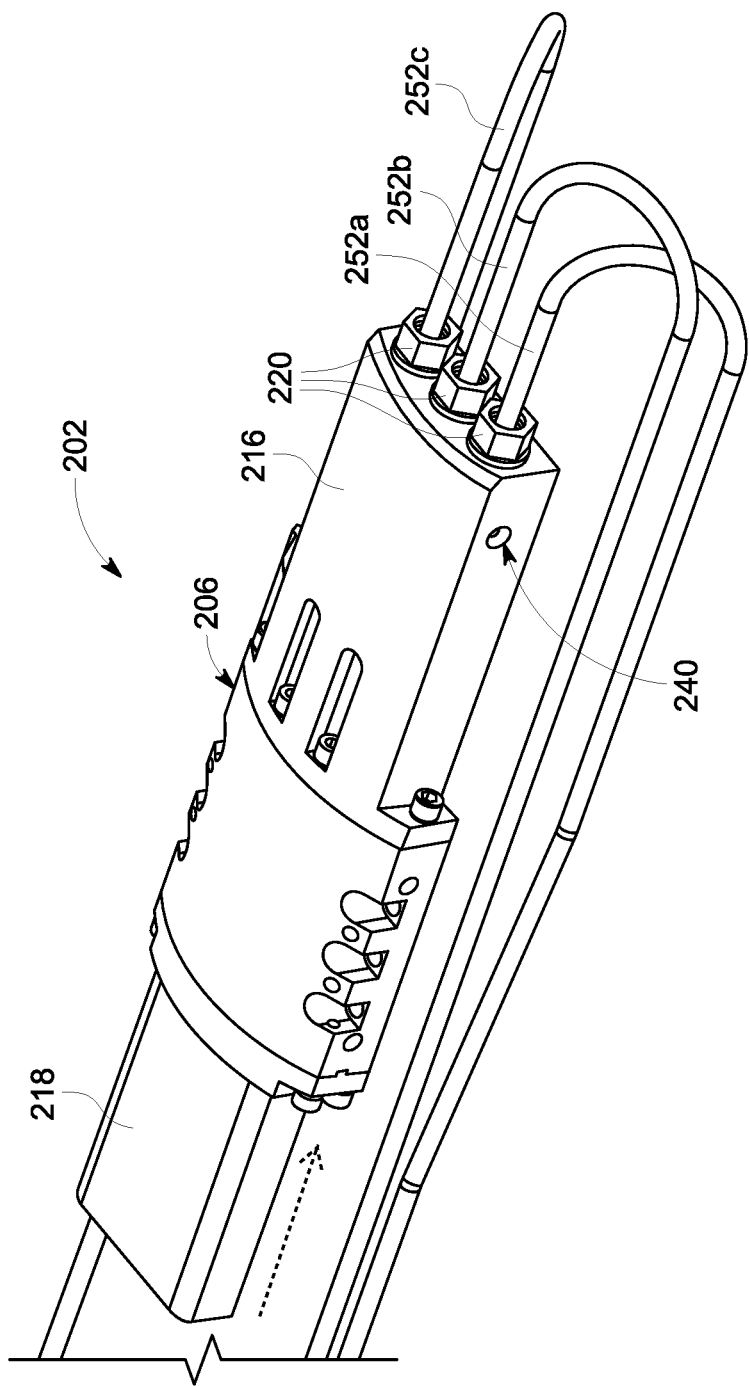
FIG. 18 shows a perspective view of a permanent downhole connector system employing a starpoint connection according to one or more embodiments of the present disclosure.

Referring now to FIGS. 18-25, there is shown a modified permanent downhole electrical connector assembly 202 much like the electrical connector assembly 202 described in U.S. Pat. No. 11,105,160. As shown in FIG. 18, this connector assembly 202 comprises a wet mate connector 206 having connected at its first end a retractable electrode housing 218, and at its opposite end the housing manifold 216. The wet mate connector 206 generally comprises housing manifold 216 for maintaining one or more connections, and electrode housing 218, lead/cable connections 220 (metal to metal seal preferred). Compression nut metal-metal seals 220 provide the required compression for sealing the connection to insulator cables 252a, 252b, 252c (shown here as a three-phase connector). The difference, however, resides within the electrode housing slider 218. In this embodiment, the electrode housing slider 218, in its first position, provides continuous electrical contact between the phases (multiple phases) when no retrievable assembly is in place, in other words, it acts as a star point. The star point is a technical term for a common connection point of a number of parallel phases.

In this embodiment, the testable permanent downhole wet mate connector star point consists of a common conductor between the three phases, three individual spring-loaded electrical contact bands in contact with the common conductor element and the contact area of the individual wet connector electrodes, the insulator housing protecting the electrical components and the sealing elements to provide the barrier between the well bore fluid and the clean dielectric fluid in the contact area. This arrangement provides the means of measuring the conductor resistance between two phases through the cable conductor from the surface while RIH, at the set depth or when POOH. When the retrievable system is deployed, the wet mate connector slider 218 is pushed away to its second position (away from the electrical contact area of the electrodes), by the plug head of the retrievable section, and with it, the common conductor element (common electrical contact block) 268 too. The common connection point 268 is therefore temporarily deactivated. When the retrievable assembly is removed and the plug head is disconnected, the permanent downhole wet mate connector slider cover 218 returns to its original position due to the spring force, thus the common conductor element 268 re-engages with the wet mate connector phase electrode contact area 270, reactivating the common connection point. This device allows testing of the permanent downhole electrical connector system before, between and after each pull of the retrievable completion.

Referring now to FIG. 19, there is shown the connector system 202 of FIG. 18 with its housing 218 removed (for ease of viewing) shown in its first position (with no retrievable section plug head engaged). There is further shown a partial cross-sectional view removing the top half of the contact block insulator housing 264 (for ease of viewing). FIG. 20A shows a top view of the connector system of FIG. 18 with its housing 218 removed (for ease of viewing). FIG. 20B shows a top view of the connector system of FIG. 20A further with the top half of the electrical block band contact 266 removed (for ease of viewing) and with the common electrical contact block 268 removed (for ease of viewing). FIG. 20C shows a top view of the connector system of FIG. 19. As shown, each wet mate connector electrode (permanent downhole connector electrode) 238 (with its respective electrode contact area 270) remains fixed in place. The electrodes 238 extend through a common electrical contact block 268 (the starpoint) with electrical block band contacts 266 aligned, in this first position, over the electrode contact areas 270. The contact block 268 is housed within an insulator housing 264, and each electrode is sealed by o-ring seals 272 (on each side of the electrode contact area) mounted within corresponding grooves in the housing 264. The contact block insulator housing is mounted on a pin slider 219 that can be moved inwardly against the force of the springs 274 when connecting a retrievable unit. The seals 272 prevent wellbore fluid intrusion that could cause a short-to-ground which would interfere with otherwise detecting any continuity change in the cables. The connectors 202 shown in FIGS. 19, 20A, 20B, 20C are shown without a bellows compensation system 208, but could certainly employ such system 208 if desired.

The common electrical contact block 268 (starpoint) creates, in this first position, contact across all electrode contact areas 270 so that electrical continuity/integrity of the three-phase cable can be monitored. These drawings depict a three-phase cable, but these teachings could be employed with 2 or more cables.

Referring now to FIGS. 21A and 21B, there is shown a connection being made between the modified connector 201 and a retrievable unit 300. The connector 201 is shown using a bellows compensation system 208. FIG. 21A shows a top view of the connector system of FIG. 20A (with some partial cross-sectional views) such as generally shown in lines 21A-21A of FIG. 7 with starpoint connection shown in a disconnected state (first position) just prior to being connected to a female wet connect assembly or plug head assembly. FIG. 21B shows a top view of the connector system of FIG. 21A (with some partial cross-sectional views) with the starpoint connection shown in a connected state (second position) after being connected to a female wet connect assembly or plug head assembly. As will be shown, during the connection process, the common electrical contact block 268 has been moved to its second position by virtue of the pin slider being pushed inwardly (against the springs 274) to move the contact block 268 to a neutral position. In this second position, the common electrical contact block 268 no longer contacts the electrode contact areas 270, and the electrodes have now entered the female connector sockets 364 and engaged with the electrical contact bands 358 in the female wet connector electrical contact block 356 of the retrievable unit. When the retrievable unit 300 is later removed, the force of the springs 274 urges the common electrical contact block 268 back to its first position where it can again serve to create contact across all electrode contact areas 270 to permit further monitoring of the cable continuity.

As will be understood by those having the benefit of the present disclosure, the permanent downhole electrical connector assemblies 202 can also include the fluid compensation features taught in U.S. Pat. No. 11,105,160. For example, referring to FIGS. 23-26, the electrical connector assembly 202 and its wet mate connector 206 further comprises a bellows/accumulator system 208 shown here attached as part of the wet mate connector 206. The bellows/accumulator system 208 further comprises a bellows first end 208*a*, a bellows second end 208*b*, a bellows annular housing 208*c*, a bellows internal annular wall 208*d* defining a bellows internal annual chamber 208*j*, a flexible sealing element 208*e* having an open fixed end 208*f* and a movable, closed end 208*g*, a movable end cap 208*h* for sealing the bellow, a bellows flexible sealing element internal cavity 208*i* for receiving wellbore fluid through open end 208*f*, a bellows annual chamber 208*j*, a connection 208*k* of bellows to the wet mate connector, and an annular connection orifice 208*l*.

In one embodiment, the bellows could be modified to serve to increase the pressure of the internal dielectric fluid (Pi) to maintain Pi greater than the wellbore pressure ($P_w$). In another embodiment, each conduit that receives a dielectric fluid could have its own bellows. In other embodiments, two or more conduits could share a common bellows.

The wet mate connector 206 generally comprises housing manifold 216 for maintaining one or more connections, and electrode housing 218, lead/cable connections 220 (metal to metal seal preferred). Compression nut metal-metal seals 220*a*, 220*b*, 220*c* provide the required compression for sealing elements 220*b* in order to form the metal-metal sealing. Metal-metal sealing element 220*b* serves as a primary metal-metal seal, installed on tubing 210 *a*,*b*,*c*, in housing 216 and connections 220 to provide the barrier between the manifold interior space 230 filled with dielectric fluid/oil 226 and the well bore fluid 228 in the manifold 242. A permanent downhole connection test seal 220*c* (elastomeric seal) provides the sealing for field pressure testing of connection 220.

The bellows 208 is connected to housing manifold 216 via bellows connection 222. A dielectric fluid port 224 is provided for charging the system at surface with dielectric fluid 226. These connections are exposed on the outside to wellbore fluid 228 which exerts a wellbore hydrostatic pressure $P_w$ (the downhole pressure generated by the column of fluid above the permanent downhole connector system). Atmospheric or ambient air pressure is indicated as $P_a$ herein.

Connection manifold 216 further comprises manifold interior space 230 (filled with dielectric fluid 226 at an internal connector pressure Pi (the pressure generated by the bellow compensator system 208 inside the permanent downhole connector system 202 and field connector plug 212 when connected to assembly 202). Flow pathway 232 provides interior space and back side of all connections in fluid communication with each other and with dielectric fluid.

A wet mate connector electrode sealing element 244 serves as the primary elastomeric seal, installed on the wet mate electrode 238 and inside housing 216. The seal 244 provides the barrier between the manifold interior space 230 filled with dielectric oil 226 and the well bore fluid 228. The lead/cable connections 220 are typically threaded 246, with various thread types (parallel, NPT, other) being possible. A field connector receptacle check valve assembly 248 provides the sealing of the pressure compensated dielectric fluid 226, at the field connector receptacle end 204 (opposite end to the bellows assembly 208).

As illustrated, each cable further comprises a cable annular space 234. Permanent downhole connector electrical power lead 236 connects the wet mate connector electrode 238 to the field connector receptacle contact pin 264. Permanent downhole connector electrical power lead overmold 236a is present over the termination between the permanent downhole connector electrical power lead 236 and the wet mate connector electrode 238.

A permanent downhole connector pressure test orifice 240 serves as a pressure port for field testing of connections 220. The permanent downhole connector pressure test manifold 242 provides a pathway/manifold for wellbore fluid 228 to provide communication with one or more sealing connections 220 on tubing 210 and to allow field pressure testing through port 240.

In case of the requirement for pressure isolation of the permanent downhole electrical connector system during deployment, this testable wet mate connector option can be used in conjunction with a standard isolation sleeve assembly such as that provided by AccessESP. Referring to FIG. 4, in this embodiment, the permanent downhole electrical connector assembly 202 would be modified according to the teachings herein regarding FIGS. 18-26.

Figure 27:
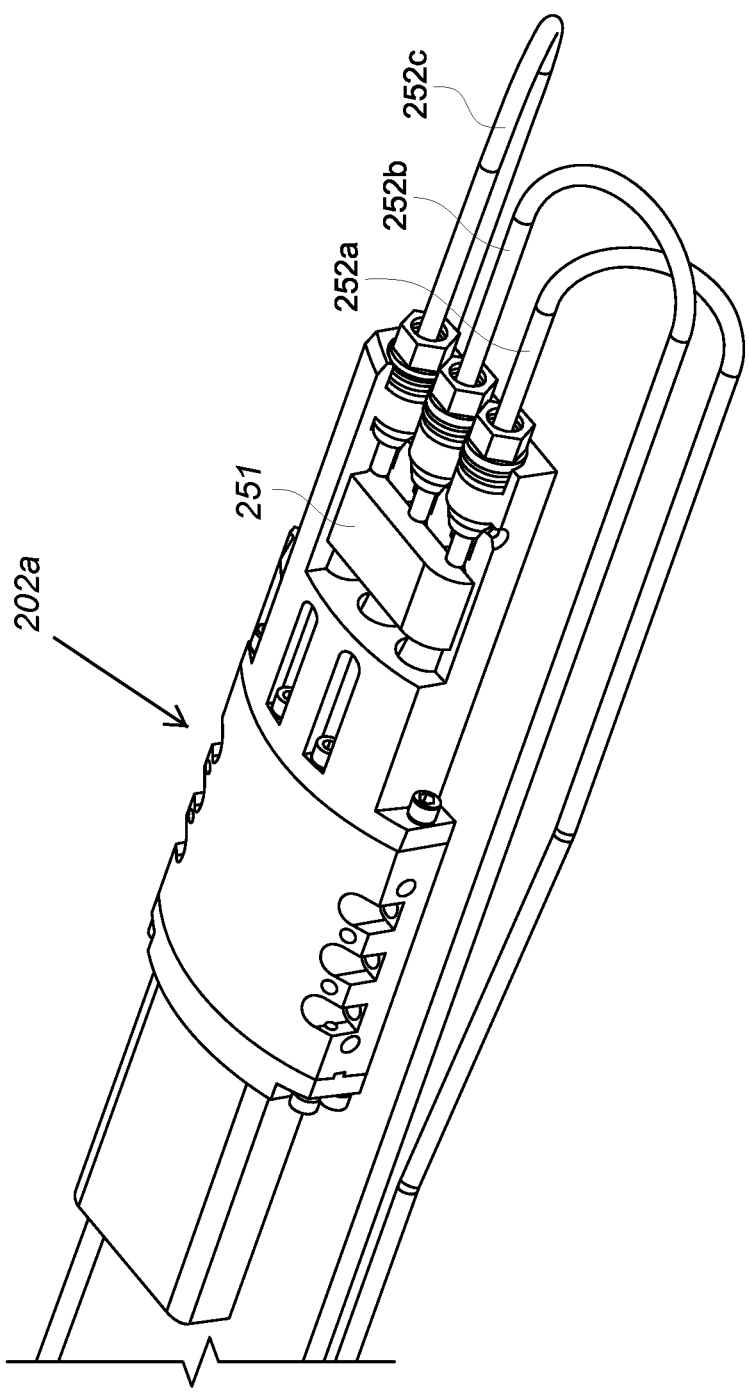
FIG. 27 shows a perspective view of a permanent downhole connector system (shown with part of top of housing manifold 218 removed for ease of viewing) employing a fusible link according to one or more embodiments of the present disclosure.
Figure 28:
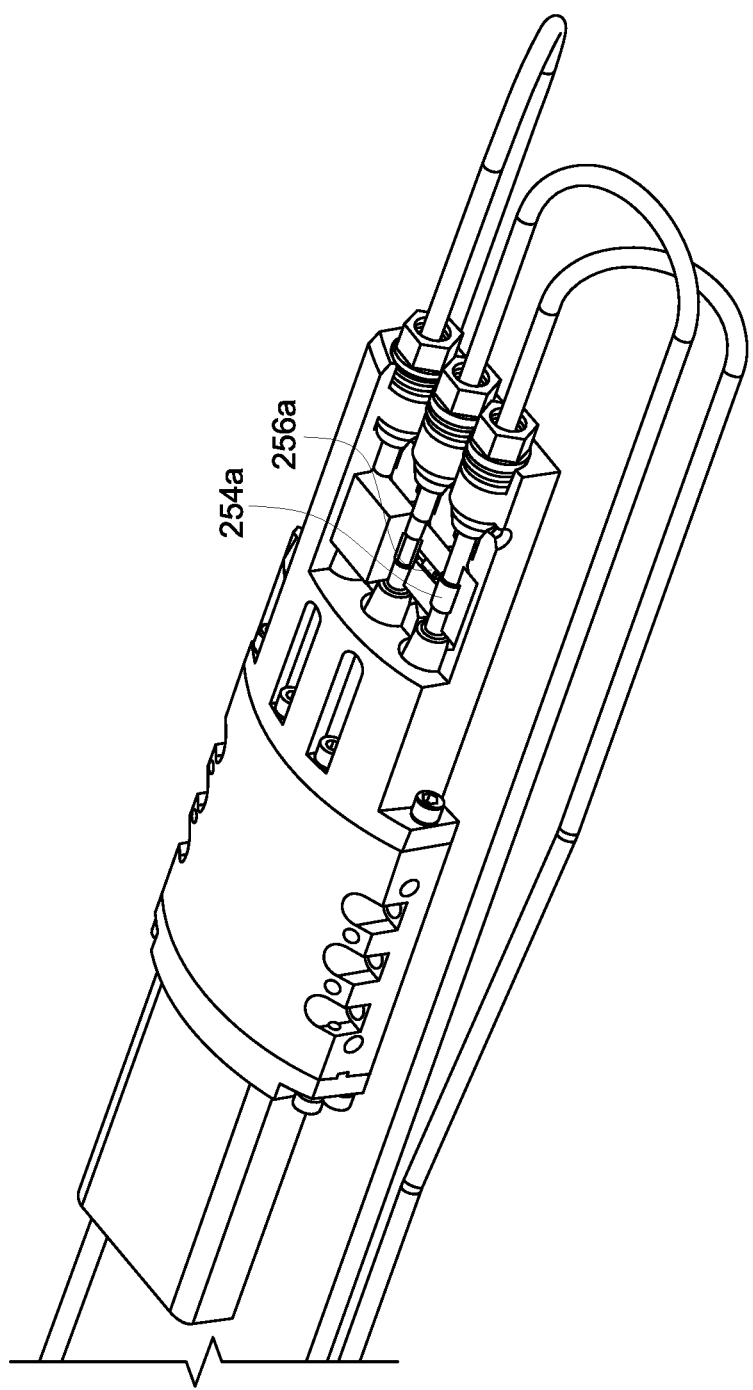
FIG. 28 shows the connector system of FIG. 27 with part of the top portion of insulating carrier 250 removed (for ease of viewing).
Figure 29:
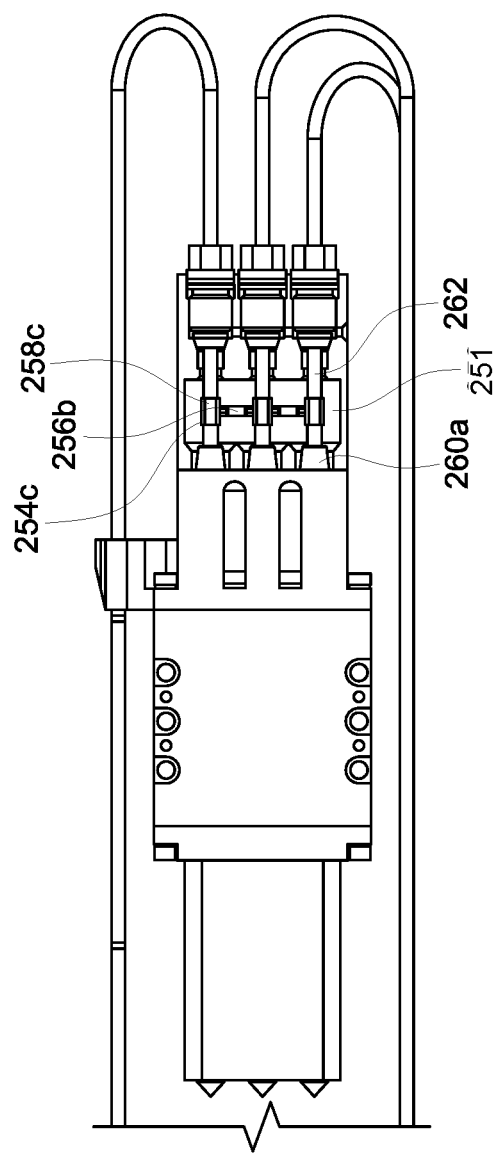
FIG. 29 shows a top view of the connector system of FIG. 28 with the top portion of insulating carrier 250 removed (for ease of viewing).

Option 4: Electrical Testing Through the Fusible Link Incorporated into the Permanent Downhole Connector Referring now to FIGS. 27-29, there is shown a modified permanent downhole electrical connector assembly 202a shown with part of housing manifold 216 removed for ease of viewing, further comprising a fusible element 256a, 256b connected by contact elements 254a, 254b, 254c between two phases, e.g., exposed lengths 258a, 258b, 258c of cables 252a, 252b, 252c that are connected to the permanent downhole connector wire conductor, such that it provides a common connection point (star point) for all phases (three phases shown here). The fusible elements 256a-b and contact elements 254a-c are housed within an insulating carrier 251 made from an insulating material that sits within housing manifold 216. Testing of the cable conductor continuity and resistance between phases and the insulation resistance of the system can be performed while RIH and at the set depth. This fusible link can be configured, such that when the motor is operated, the amount of current flowing through the conductors will melt the fusible element(s) 256a, 256b, thus breaking the continuity between the phases. After the linkage is broken, the common connection point in the permanent completion is permanently deactivated. This device does not allow re-testing of the ESP cable after the retrievable assembly is pulled.

In case of the requirement for pressure isolation of the permanent downhole electrical connector system during deployment, this testable wet mate connector option can be used in conjunction with a standard isolation sleeve assembly such as that provided by AccessESP. Referring to FIG. 4, in this embodiment, the permanent downhole electrical connector assembly 202 would be modified according to the teachings herein regarding FIGS. 27-29.

Options 1 and 2 described above provide the following features: Common electrical testing method for a through tubing deployed ESP; Monitoring of the ESP cable conductor continuity/resistance and permanent downhole connector system insulation resistance while RIH, using the retrievable system (option 1) or a custom plug arm (option 2); Testing of the mechanical latching of the retrievable onto the permanent completion close to surface or at depth; Pressure isolation possible with the custom test plug arm; Wireline deployable; Does not require additional changes of the permanent completion thus compatible with existing permanent completions.

Options 3 and 4 described above provide the following features: Electrical testing method for a through tubing deployed ESP, without using the retrievable system or a custom test plug arm; (Option 3 only) Monitoring of the ESP cable conductor continuity/resistance and permanent downhole connector system insulation resistance while RIH, between pulls and during POOH; Pressure isolation possible with AccessESP standard isolation sleeve; Decrease of deployment time as there is no need for wireline runs; Cost savings for equipment and installation.

In one or more embodiments, a periodic report is generated based on the tested downhole electrical cable installation. The periodic report may be transmitted to a computer system associated with the permanent completion. The periodic report may be associated with a test result and/or a report of a continuous monitoring activity. The periodic report may be used to analyze one or more metrics associated with a permanent downhole connector system during installation. The periodic report may be transmitted over Internet protocol communication to a remote location to allow remote monitoring of the installation.

Although it is envisioned that the cable system could be charged with dielectric fluid along the entire production tubing string to surface, in a preferred embodiment, dielectric fluid compensation is provided up to a packer or other equipment in the upper production string.

It will also be understood that the cable tubing could incorporate other bi-phase conduits, e.g., downhole pressure sensor wires, downhole hydraulic conduit, or downhole gauges.

While the apparatus and methods of this invention have been described in terms of preferred embodiments, it will be apparent to those of skill in the art that variations may be applied to the process and system described herein without departing from the concept and scope of the invention. All such similar substitutes and modifications apparent to those skilled in the art are deemed to be within the scope and concept of the invention. Those skilled in the art will recognize that the method and apparatus of the present invention has many applications, and that the present invention is not limited to the representative examples disclosed herein. Moreover, the scope of the present invention covers conventionally known variations and modifications to the system components described herein, as would be known by those skilled in the art. While the apparatus and methods of this invention have been described in terms of preferred or illustrative embodiments, it will be apparent to those of skill in the art that variations may be applied to the process described herein without departing from the concept and scope of the invention. All such similar substitutes and modifications apparent to those skilled in the art are deemed to be within the scope and concept of the invention as it is set out in the following claims.

We claim:

1. A method of monitoring for any change in continuity of conductors in electrical power leads connected to a wet mate connector on a downhole permanent completion comprising the steps of:
   a. installing the wet mate connector on the downhole permanent completion, the wet mate connector comprising
      i. a housing manifold having a first closed end, a second open end, an interior chamber, and interior guide tracks extending perpendicularly from the housing manifold second open end into the interior chamber;
      ii. two or more electrodes contained within the housing manifold, each of the two or more electrodes defining a phase and comprising
         an outer surface;
         a first electrode end proximate the housing manifold first end and connectable, via a power lead connection located in the housing manifold first end, to a separate electrical power lead, containing a conductor, extending from a surface electrical power source,
         a second electrode end section extending out of the housing manifold second end, the second electrode end section containing an electrical contact band located around the electrode outer surface, the electrical contact band capable of transmitting electrical signals to a corresponding retrievable tool female connector electrical contact band in the retrievable tool female connector once connected thereto;
      iii. a retractable electrode housing having a first end slidably connected to and extending into the housing manifold second end and a second retractable electrode housing end extending out of the housing manifold to cover the two or more electrodes, the retractable electrode housing further comprising one or more guide tracks slidably connected to the housing manifold interior guide tracks to guide the movement of the retractable electrode housing within the housing manifold, the retractable electrode housing capable of moving between a first closed position covering the two or more electrodes, and a second open position when retracted into the housing manifold, the retractable electrode housing second end having an electrode end face comprising two or more electrode end face apertured openings permitting the two or more electrode second end sections to extend therethrough when the retractable electrode housing moves inwardly into the second, open position within the housing manifold, the retractable electrode housing further comprising a shoulder stop capable of abutting a mechanical stop built into the housing manifold to set a fixed position for the first closed position of the retractable electrode housing;
      iv. a slidable metal common connection starpoint contact block mounted within the retractable electrode housing and having two or more starpoint contact block apertured openings permitting the two or more electrode second end sections to extend therethrough, the slidable metal common connection starpoint contact block capable of occupying a first contact block position contacting at least a part of the electrical contact band of each of the two or more electrodes to create a bridge contact across the electrical contact band of each of the two or more electrodes when the retractable electrode housing is in its first closed position covering the two or more electrodes,
         the slidable metal common connection starpoint contact block capable of occupying a second retracted contact block position within the retractable electrode housing not contacting any part of the electrical contact band of each of the two or more electrodes to disconnect the bridge contact across all of the two or more electrodes, when the retractable electrode housing is in its second, open position;
      v. an insulated cover surrounding and secured to the slidable metal common connection starpoint contact block, and further comprising a corresponding two or more insulated cover apertured openings aligned with the slidable metal common connection starpoint contact block apertured openings to permit the two or more electrodes to pass therethrough, two or more sealing elements positioned on both sides of the electrical contact band of each of the two or more electrodes to seal off the area of the electrical contact band of each of the two or more electrodes from intrusion by a wellbore fluid; and
      vi. a spring mounted over each of the two or more electrodes, positioned between the insulated cover and the housing manifold first closed end, the spring tensioned to maintain the retractable electrode housing in its first closed position in the absence of a connection being made with the retrievable tool female connector, and to permit the retractable electrode housing to be moved to its second open position when a connection is made with the retrievable tool female connector;
      wherein when the retractable electrode housing is in its first closed position in the absence of a connection being made with the retrievable tool female connector, the slidable metal common connection starpoint contact block occupies its first contact block position permitting common contact across the electrical contact band of each of the two or more electrodes to permit monitoring for any change in continuity of the separate electrical power lead of each of the two or more electrodes once connected to the respective power lead connection for each of the two or more electrodes;
      wherein when the retrievable tool female connector is connected to the wet mate connector, the retractable electrode housing is moved to its second open position, the slidable metal common connection starpoint contact block is moved to its second contact block position, and the electrical contact band of each of the two or more electrodes is permitted to make electrical contact with the corresponding retrievable tool female connector electrical contact band in the retrievable tool female connector; and
      wherein, when the retrievable tool female connector is disconnected from the wet mate connector, the retractable electrode housing is moved back to its first closed position, the slidable metal common connection starpoint contact block again occupies its first contact block position permitting common contact across the contact band of each of the two or more electrodes to again permit monitoring for any change in continuity of the separate electrical power lead of each of the two or more electrodes once connected to the respective two or more power lead connection for each of the two or more electrodes;

b. running the permanent completion in hole (RIH);

c. measuring the conductor resistance between the phase of one of the two or more electrodes and the phase of another one of the two or more electrodes through the power lead from the surface while RIH, d. measuring the conductor resistance between the phase of one of the two or more electrodes and the phase of another one of the two or more electrodes through the power lead from the surface at a set depth, and e. measuring the conductor resistance between the phase of one of the two or more electrodes and the phase of another one of the two or more electrodes through the power lead from the surface when pulling out of hole (POOH).

2. The method of claim 1 wherein the retrievable tool is a retrievable electrical submersible pump (ESP) assembly.

3. The method of claim 2 comprising the further steps of connecting the retrievable ESP assembly thereby moving the slidable metal common connection starpoint contact block to its second position and discontinuing such measuring of conductor resistance.

4. The method of claim 3 comprising the further steps of disconnecting the retrievable ESP assembly thereby moving the slidable metal common connection starpoint contact block to its first position and continuing measuring of conductor resistance.

5. The method of claim 1 further comprising the step of providing the wet mate connection with fluid compensation to further prevent well bore fluid intrusion.

6. The method of claim 5 wherein the wet mate connection further comprises:
 a. a first inside chamber within the housing manifold;
 b. a second inside chamber with the retractable electrode housing;
 c. one or more electrical conduits having an internal annular space surrounding an electrical wire/cable, a first conduit end and a second conduit end, the first conduit end being connected to one of the one or more power lead connections located in the housing manifold, wherein the conduit annular space is in fluid communication with the housing manifold first inside chamber and the retractable electrode housing second inside chamber and defining a fluid flow path;
 d. a dielectric fluid port in fluid communication with the first inside chamber within the housing manifold for introducing a dielectric fluid into the fluid path, the dielectric fluid creating an internal fluid pressure; and
 e. a bellows having first and second ends, and an interior annular chamber, the first bellows end being connected to the connector housing in fluid communication with the housing inside chamber, the bellows second end being exposed to downhole wellbore fluid pressure and capable of reacting to the wellbore pressure to cause the bellows to provide a compensating adjustment to the internal fluid pressure.

7. The method of claim 1 wherein the two or more electrodes comprises three electrodes; the two or more electrode end face apertured openings comprises three end face apertured openings; the two or more electrode second end sections comprises three electrode second end sections; the two or more starpoint contact block apertured openings comprises three starpoint contact block apertured openings; and the two or more insulated cover apertured openings comprises three insulated cover apertured openings.

* * * * *